US012317444B2

(12) United States Patent
Huet et al.

(10) Patent No.: US 12,317,444 B2
(45) Date of Patent: May 27, 2025

(54) IT HARDWARE APPARATUS AND METHOD

(71) Applicant: Submer Technologies SL, L'hospitalet de Llobregat (ES)

(72) Inventors: Jonathan Huet, L'hospitalet de Llobregat (ES); Julia Marsal Perendreu, L'hospitalet de Llobregat (ES); David Montes Monteserin, L'hospitalet de Llobregat (ES); Scott Noteboom, L'hospitalet de Llobregat (ES)

(73) Assignee: Submer Technologies SL, Barcelona (ES)

( * ) Notice: Subject to any disclaimer, the term of this patent is extended or adjusted under 35 U.S.C. 154(b) by 171 days.

(21) Appl. No.: 18/034,588

(22) PCT Filed: Oct. 29, 2021

(86) PCT No.: PCT/EP2021/080146
§ 371 (c)(1),
(2) Date: Apr. 28, 2023

(87) PCT Pub. No.: WO2022/090476
PCT Pub. Date: May 5, 2022

(65) Prior Publication Data
US 2023/0403813 A1    Dec. 14, 2023

(30) Foreign Application Priority Data

Oct. 29, 2020 (GB) ..................... 2017158

(51) Int. Cl.
*H05K 7/14* (2006.01)
*H05K 7/20* (2006.01)

(52) U.S. Cl.
CPC ....... *H05K 7/1489* (2013.01); *H05K 7/20781* (2013.01)

(58) Field of Classification Search
CPC ............. H05K 7/1489; H05K 7/20781; H05K 7/20236; H05K 7/1498; B25J 5/007; B25J 9/04; B25J 11/008; B25J 15/0286
See application file for complete search history.

(56) References Cited

U.S. PATENT DOCUMENTS

| 10,765,026 | B2* | 9/2020 | Adrian ................. H05K 7/1492 |
| 2016/0107312 | A1 | 4/2016 | Morrill et al. |
| 2020/0060033 | A1 | 2/2020 | Adrian |
| 2020/0081439 | A1 | 3/2020 | Mukherjee et al. |
| 2020/0093026 | A1 | 3/2020 | Enright et al. |

* cited by examiner

*Primary Examiner* — Anthony M Haughton
*Assistant Examiner* — Hung Q Dang
(74) *Attorney, Agent, or Firm* — KIRTON McCONKIE; Evan R. Witt

(57) ABSTRACT

Apparatus and method for the positional interchange of IT hardware nodes at an IT hardware rack. The present apparatus comprises at least one tab attached or attachable to an IT hardware node, each tab provided with a first lock part, an articulator unit having at least one movable gripper to releasably engage the tabs, and the movable gripper provided with a second lock part to releasably lock to the first lock part and allow the gripper to releasably support each of the IT hardware nodes via the tabs for insertion and/or withdrawal at the IT hardware rack.

23 Claims, 19 Drawing Sheets

IT HARDWARE APPARATUS AND METHOD

FIELD OF DISCLOSURE

The present disclosure relates to an apparatus and method for the automated positional interchange of IT hardware nodes at an IT hardware rack.

BACKGROUND

Data centers are buildings or dedicated spaces within a building used to house computer systems and associated components. Operation and maintenance of data centers typically require human intervention. In particular, the operation and maintenance of IT hardware nodes stored in IT hardware racks typically involve tasks that are generally executed by human intervention.

The massive growth in data and the increased speed at which businesses operate mean that manual monitoring and processing of different tasks within data centers is not sufficiently agile and repeatable to be effective, which can put businesses at risk. As the need to manage larger volumes of servers increase, the continuous need for improvement in automation and efficiency in the data center industry is intensified.

Data center automation is the process by which routine workflows and processes of a data center such as scheduling, monitoring, maintenance, or application delivery are managed and executed without or with minimised human administration. Data center automation increases agility and operational efficiency. Some attempts have been made to automate the data center industry. Examples include micro-modular data centers to house immersion cooling bath/tanks. Such systems have robotic manipulators customized to latch onto a server, lift it out of an immersion tank and place it into a second enclosure.

However, existing systems lack configuration and compatibility for integration into existing data center installations. Such existing systems are designed specifically to be self-contained and implemented as stand-alone modular units. Data center configurations vary substantially, from vertical rack configurations to more sophisticated storage solutions such as immersion cooling baths/tanks, which present a horizontal configuration. Accordingly, the positional interchange of IT hardware nodes at different types of hardware rack remains a problem.

As such, there is a need for a system offering a universally integrated solution for the positional interchange of IT hardware nodes at different types of IT hardware rack and data center installations.

SUMMARY

It is an object of the present disclosure to provide an apparatus and a method for the precise, efficient, and reliable positional interchange of IT hardware nodes at an IT hardware rack. It is a further specific objective to provide an adaptable apparatus and method to universally integrate the positional interchange of IT hardware nodes at one or a plurality of an IT hardware racks. It is a further objective to provide an adaptable apparatus and method for the positional interchange of IT hardware nodes compatible for integration and use and with any IT hardware nodes and/or IT hardware rack of different and multiple configurations.

According to a first aspect of the present disclosure there is provided IT hardware apparatus for the positional interchange of IT hardware nodes at an IT hardware rack comprising: at least one tab attached or attachable to IT hardware nodes removably mountable within an IT hardware rack; each of the tabs provided with a first lock part; an articulator unit having at least one movable gripper to releasably engage the tabs; and the movable gripper provided with a second lock part to releasably lock to the first lock part and allow the gripper to releasably support each of the IT hardware nodes via the tabs for insertion and/or withdrawal at the IT hardware rack.

Optionally, the first lock part comprises at least one opening and the second lock part comprises at least one lug having a shape and size approximately equal to a shape and size of the opening to enable the lug to be received within the opening. Such a configuration provides a contribution to the secure lock between the first lock part and the second lock part.

Optionally, the opening and the lug are generally elongate in a lengthwise direction of each tab and/or IT hardware node.

Optionally, the opening and the lug comprise a width that decreases in a direction towards a front part of the respective opening and the lug, the front part being furthest from an attachment part of each tab for attachment to the IT hardware node relative to a rear part of the opening and the lug. Such a configuration provides a contribution to a improved distribution of forces at the lug when received within an opening. This enables the gripper to support an IT hardware node in any orientation (including and between vertical and horizontal) for insertion and/or withdrawal at an IT hardware rack.

Optionally, the opening and the lug comprise a width that decreases in a direction towards a rear part of the opening and the lug, the rear part being closest to an attachment part of each tab for attachment to the IT hardware node relative to a front part of the opening and the lug. Such a configuration provides a contribution to a improved distribution of forces at the lug when such lug is received within an opening. Optionally, the opening and the lug comprise a generally rhombic shape profile.

Optionally, the lug comprises a body having a front and rear shoulder and a head projecting from the body at a position between the front and rear shoulder. Optionally, the head comprises a tapered thickness that decreases in a direction away from the body. Optionally, a shape profile of the head is any one of a cone, a dome or a barb. Such a configuration provides a contribution to the alignment of the second lock part and, in particular to facilitate the lug being received within the opening.

Optionally, the first lock part is a slot and the body of the lug comprises a thickness being equal to or greater than a thickness of the tab such that the head is capable of insertion completely through the slot from a first side surface of the tab such that an underside surface of the head is positionally opposed to a second side surface of the tab.

Optionally, the articulator unit comprises two movable grippers movably mounted at a unit body and configured for lateral movement at the unit body towards one another and in to engaging contact with at least one tab of the IT hardware node. Such a configuration provides a contribution to the engagement of different IT hardware nodes having different configurations, components parts, dimensions and in particular different configurations of engageable tab(s).

Optionally, each of the grippers comprise a respective lug.

Optionally, the apparatus comprises one or two tabs for each of the IT hardware nodes, each tab having at least one slot.

Optionally, the apparatus further comprises a set of the IT hardware nodes, the set comprising any one or a combination of a computer nodes to perform computational tasks, power nodes to supply power to other of the IT hardware nodes and battery nodes.

Optionally, some of the IT hardware nodes comprise a first size and have two tabs and some of the IT hardware nodes comprise a second size smaller than the first size and have one tab.

Optionally, the IT hardware rack is an immersion cooling bath to contain an immersion cooling liquid, the IT hardware nodes being mountable within the immersion cooling bath and capable of immersion within the immersion cooling liquid such that the tabs project upwardly above a surface of the immersion cooling liquid.

Optionally, the apparatus further comprises a plurality of electronic ports provided at a base of the immersion cooling bath, each of the IT hardware nodes configured to dock mechanically and electrically with the electronic ports. Optionally, each of the IT hardware nodes comprise an electronic key to couple with each of the respective electronic ports to provide the mechanical and electrical dock.

According to a further aspect of the present disclosure there is provided a method of releasable mechanical engagement of IT hardware nodes at an IT hardware rack comprising: providing a plurality of IT hardware nodes for insertion in an IT hardware rack; each of the IT hardware nodes having at least one tab projecting from an end region of the IT hardware nodes and provided with a first lock part; providing an articulator unit having at least one movable gripper provided with a second lock part; actuating the articulator unit to move the gripper to provide releasable engagement of the first lock part by the second lock part of one of the IT hardware nodes; wherein after engagement of the first and second lock parts an IT hardware node is capable of being inserted at the IT hardware rack.

According to yet a further aspect of the present disclosure there is provided a method of releasable mechanical engagement of IT hardware nodes at an IT hardware rack comprising: providing a plurality of IT hardware nodes for withdrawal from the IT hardware rack; each of the IT hardware nodes having at least one tab projecting from an end region of the IT hardware nodes and provided with a first lock part; providing an articulator unit having at least one movable gripper provided with a second lock part; actuating the articulator unit to move the gripper to provide releasable engagement of the first lock part by the second lock part of one of the IT hardware nodes; wherein after engagement of the first and second lock parts an IT hardware node is capable of being withdrawn from the IT hardware rack.

Optionally, the first lock part comprises at least one opening and the second lock part comprises at least one lug having a shape and size approximately equal to a shape and size of the opening to enable the lug to be received within the opening. Such a configuration provides a contribution to the secure lock between the first lock part and the second lock part.

Optionally, the opening and the lug are elongate in a lengthwise direction of each IT hardware node.

Optionally, the opening and the lug comprise a width that decreases in a direction towards a front part of the opening and the lug, the front part being furthest from the IT hardware node relative to a rear part of the opening and the lug. Such a configuration provides a contribution to a improved distribution of forces at the lug when received within an opening allowing the gripper to support an IT hardware node in any orientation and for insertion and/or withdrawal at an IT hardware rack.

Reference within this specification to 'IT hardware node' should be understood as any IT hardware component that can be present and/or stored in an IT hardware rack and that may be used to perform activities such as, although not exclusively, computational tasks or power supply. Accordingly, the term 'IT hardware node' encompasses alternative terms such as: IT hardware component, IT hardware server, computer server, networking hardware, electronic equipment module, rack-mountable equipment, rack-mount chassis, shelf or any other equipment designed to be placed in an IT hardware rack.

Reference within this specification to 'IT hardware rack' should be understood as any frame or enclosure for mounting multiple electronic equipment modules or IT hardware nodes. In particular, although not exclusively, reference to IT hardware rack encompasses vertical configurations such as the commonly known 19-inch rack and/or horizontal configurations such as an immersion cooling bath tank.

Reference within this specification to 'tab' should be understood as any material attached, attachable or projecting from an edge, end or side of the IT hardware nodes. The number of tabs provided in an IT hardware nodes, and the distance between them if more than one is required may vary depending on the user. For instance, one user may have a first type of IT hardware node such as a high-density sled. Due to its measurements, only one tab may be required to perform the gripping and engagement.

A further user may have a second type of IT hardware node such a full-width node. Due to the dimensions of such nodes, two tabs may be provided at a specific separation distance from one another, with both tabs being engaged by the present apparatus. A further user may have a third type of IT hardware node such a full-width node presenting different dimensions than an alternate full-width node. Accordingly, the lateral direction movement of each grippers enables engagement for different IT hardware nodes having different component parts and/or dimensions.

Reference within this specification to 'opening' encompasses alternative terms such as a slot, slit, recess, cavity or indentation.

Reference within this specification to a 'lug' encompasses a projection, key, rib, protrusion or abutment capable of being received within a respective opening, slot or recess.

The present apparatus and method is configured for operation and integration with all types of IT hardware cooling systems including in particular conventional vertical rack cabinets in which the nodes are mounted and oriented horizontally and arranged as a vertical stack, as well as horizontal rack cabinets in which the nodes are mounted and oriented vertically and arranged as an horizontal stack. Such systems are typically air/fan-cooled, water-cooled and/or coolant-cooled. Suitable applications may include air-based cooling with traditional Computer Room Air Condition (CRAC) systems, air based cooling with traditional Computer Room Air Handler (CRAH) systems, free air cooling, in-rack heat extraction systems, water-cooled racks and servers, direct immersion cooling systems, sealed liquid cooling or 'Liquid to the Chip' cooling systems, etc.

BRIEF DESCRIPTION OF DRAWINGS

A specific implementation of the present invention will now be described, by way of example only, and with reference to the accompanying drawings in which.

DETAILED DESCRIPTION OF PREFERRED EMBODIMENT OF THE INVENTION

Figure 1:
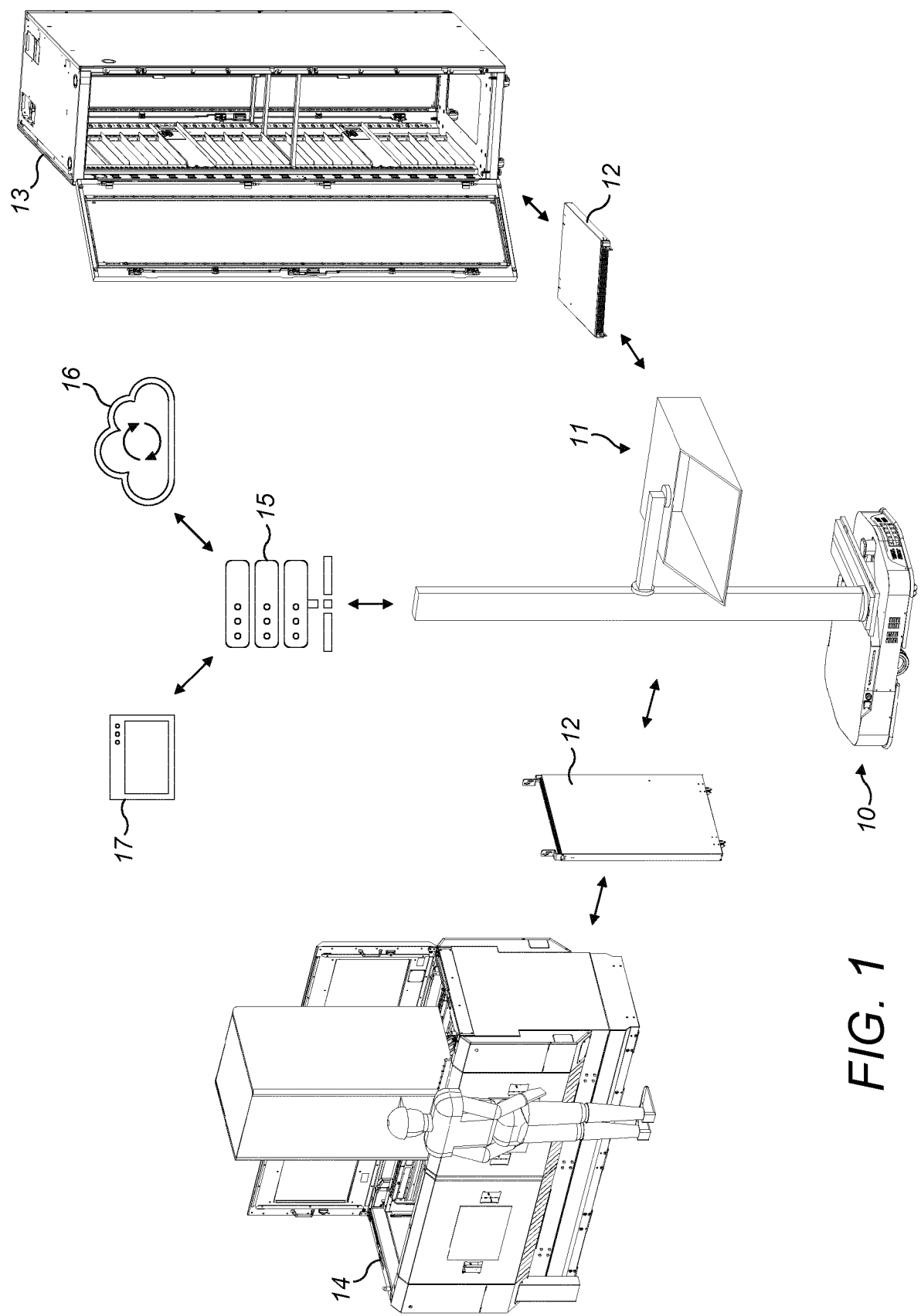
FIG. 1 illustrates schematically components and units within a system for the automated positional interchange of IT hardware nodes at one or a plurality of IT hardware racks according to a specific implementation.

Referring to FIG. 1, the present apparatus and method provides a system for the automated positional interchange of IT hardware nodes at one or a plurality of IT hardware racks. Within this specification, reference to an IT hardware rack encompasses fan or air-cooled IT hardware storage cabinets in addition to liquid immersion cooled IT hardware racks alternatively termed immersion cooling baths (containing a dielectric coolant liquid). The present system may be configured for full automation with operational control provided by software running/implemented on one or more computer units/servers located remote or proximate to the present apparatus.

Such software for the computerised and electronic control of mechanical actuators (including electromechanical, electrohydraulic, electropneumatic and/or electromagnetic) will be familiar to those skilled in the art. The present apparatus, method and system is configurable for use with a variety of different types of software for the automated control of such electronically controllable mechanical components and actuators.

The present apparatus comprises a primary articulator indicated generally by reference that, in turn, mounts a secondary articulator indicated generally by reference 11. The primary and secondary articulators 10, 11 provide a unified mechanical articulator for the positional interchange of IT hardware nodes illustrated generally by reference 12. Reference within this specification to an IT hardware node encompasses IT hardware servers or computers (to provide computational tasks), power units or nodes (such as power shelf units to provide electricity to other IT hardware nodes) and battery units and nodes to provide secondary or default power to one or more nodes, server units or IT hardware racks to avoid failure. As will be described, the present apparatus and method is compatible for use with a plurality of different types, sizes and shapes of IT hardware nodes including what are typically referred to as 'full-width nodes' that occupy the full width of an IT hardware rack, container or bath as well as 'high density nodes' that are narrower than full width nodes and are optionally mountable and/or provided with a chassis and/or a sled (insertable within a chassis).

The present system, apparatus and method is advantageous via its component parts and sequence and steps for the integration and/or operation with a plurality of different types of IT hardware nodes and IT hardware racks so as to provide the automated positional interchange of nodes of an existing IT hardware server system that may be fan/air cooled (rack 13) and/or liquid immersion cooled (rack 14).

The present system comprises a control unit 15 provided in wired or wireless communication with the primary and secondary articulators 10, 11. Control unit 15 may be implemented as a PC or other computer device including a machine control unit (MCU), PCB, processor, data storage, memory and communication components and protocols. Control unit 15 is provided or configured for integration with a user interface 17 to allow user control, adjustment and interrogation of the present system via local or remote access. User interface 17 may comprise one or more display screens and input peripherals such as keyboards, touchscreens as will be appreciated. Control unit 15 via its communication components and protocols is configured for the two-way data communication with a cloud network illustrated generally by reference 16. As will be described the present system comprises various electromechanical components and operational sensors enabling the automated, semi-automated and/or manual positional and engagement monitoring of the various system components including in particular the engagement and disengagement of the IT hardware nodes 12 via the primary and secondary articulators 10, 11 and/or the insertion and withdrawal of the IT hardware nodes at the respective IT hardware racks 13, 14.

Figure 2:
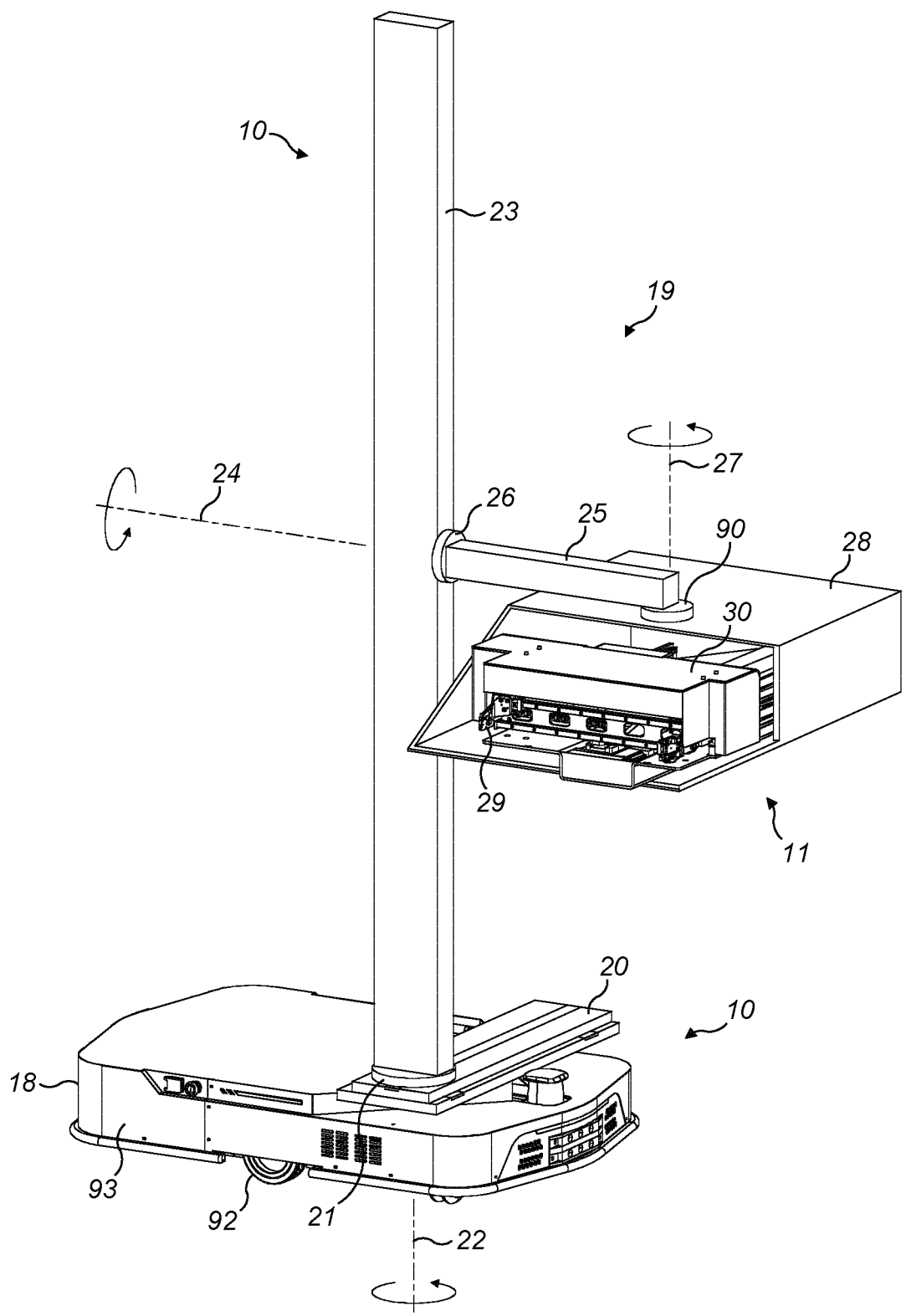
FIG. 2 is a perspective view of a primary and a secondary articulator configured for the insertion and withdrawal of IT hardware nodes at an IT hardware rack within the system of FIG. 1.

Referring to FIG. 2, primary articulator 10 comprises a primary support 18. Support 18 is implemented as an automated guided vehicle (AGV) having ground engaging wheels 92 mounted to a chassis 93. Support 18 comprises components and configuration typically associated with AGVs including one or more electric motors, an electronic control unit, a battery and wired or wireless comms for remote control via the control unit 15 optionally via additional sub control units (not shown). A base rail 20 is mounted to an upward facing side of support 18 and extends generally horizontally with the primary articulator 10 supported on level ground. A post 23 extends upwardly and generally vertically from support 18 and is slidably mounted at rail 20 via a first pivot joint 21. Accordingly, post 23 is configured for rotation about its longitudinal axis 22 at any position along rail 20. Primary articulator further comprises a beam 25 mounted to and projecting laterally from post 23 via a second pivot joint 26. Accordingly, beam 25 is capable of rotation about its longitudinal axis 24. Pivot joint 26 is mounted at post 23 via a linear track and/or rail similar to rail 20 so as to enable beam 25 to move linearly along the length of post 23 between a raised or elevated position (at an upper end of post 23) and a lowered position proximate to support 18 (at a lower end of post 23).

The primary articulator 10 further comprises a first linear actuator (not shown) coupling the first pivot joint 21 to the rail 20 so as to provide the linear translation of the post 23 along rail 20 and a second linear actuator (not shown) coupling the second pivot joint 26 and the post 23 to provide the linear transport of the beam 25 along the length of post 23. The primary articulator 10 further comprises a third pivot joint 90 coupling the secondary articulator 11 to beam 25. Third pivot joint 90 is configured for rotation about axis 27 aligned generally perpendicular to beam 25. The primary articulator 10 further comprises respective first second and third rotary actuators (not shown) provided respectively at each of the first second and third pivot joints 21, 26, 90 so as to provide the mechanical rotation of the various component parts relative to one another. Each of the pivot joints 21, 26, 90 and respective linear (not shown) and rotary actuators (not shown) may comprise one or a plurality of sensors to provide monitoring and responsive feedback on the relative position of the various component of the primary and secondary articulators 10, 11 during positional interchange of the IT hardware nodes 12 at the racks 13, 14. The rail 20, post 23 and/or beam 25 provide a unitary manipulator arm indicated generally by reference 19 adapted for the position interchange of the IT hardware nodes 12.

Secondary articulator 11 comprises a size and configuration generally smaller than the primary articulator 10 so as to be mountable at the primary articulator 10 via beam 25, post 23 and rail 20. Secondary articulator 11 comprises an articulator body indicated generally by reference 30 that supports a pair of opposed grippers indicated generally by reference 29. Alternatively, each gripper may be termed a gripper finger, and are adapted for the lateral movement towards and away from one another so as to releasably engage and positionally support the IT hardware nodes 12 for insertion and withdrawal at least one of the IT hardware racks 13, 14. Secondary articulator 11 is adapted to be suspended and mountable at the end of the articulator arm 19 and is configured for positional movement independently of the primary articulator 10. According to the present system, primary articulator 10 is adapted primarily for large or 'coarse' transport/translational movement whilst secondary articulator 11 is adapted specifically for 'fine' or 'finite' positional adjustment of grippers 29 and accordingly nodes 12.

Additionally, primary articulator 10 is configured further via its various linear and rotary actuators (as described) to provide 'fine' or 'finite' positional adjustment of grippers 29 to minimise utilisation of secondary articulator 11 as necessary.

As will be appreciated, any manipulator system for the automated insertion and withdrawal of IT hardware nodes at one or a plurality of docking regions or slots (not shown) at the racks 13, 14, must be compatible for operation with positional tolerances of a round or less than 1 mm so as to avoid misalignment, damage or failure of the system during withdrawal but particularly insertion of the nodes 12 at the racks 13, 14. The present system and in particular the secondary articulator 11 is specifically adapted for precision and repeatability during interchange of the IT hardware nodes. Additionally, the present apparatus and system is adapted for the secure gripping of the nodes 12 during insertion and withdrawal at the racks 13, 14 to avoid automation failure and/or damage of the nodes during transport.

Via the support 18 and the manipulator arm 19, the secondary articulator 11 is configured for movement towards and away from each rack 13, 14 (in the horizontal plane) above the floor and to be orientated and suspended in any position between horizontal and vertical and at any angle of inclination relative to vertical or horizontal. As such, a node 12 mounted horizontally within the rack 13 may be engaged by grippers 29, withdrawn from rack 13 (via actuation of secondary articulator 11 and then transported to rack 14 via primary articulator 10 for subsequent insertion into rack 14) via secondary articulator 11 as a final stage/sequence. The primary support 18 implemented as an AGV provides a convenient vehicle for the automated positional transport of the nodes 12 between different stored locations at a plurality of different racks 13, 14 (or other storage locations, cabinets or work stations) with the storage orientations being for example horizontal (rack 13) or vertical (rack 14). That is, primary articulator 10 is adapted for translational (e.g. substantially linear) and rotational manipulation of nodes 12 between insertion and withdrawal operations at the respective racks 13, 14. The present system is therefore configurable for operation with a variety of different types of node storage units and for the positional interchange of nodes 12 at different slots within the same rack 13, 14 and/or the positional interchange of nodes 12 into slots of different or separate racks 13, 14.

Figure 3:
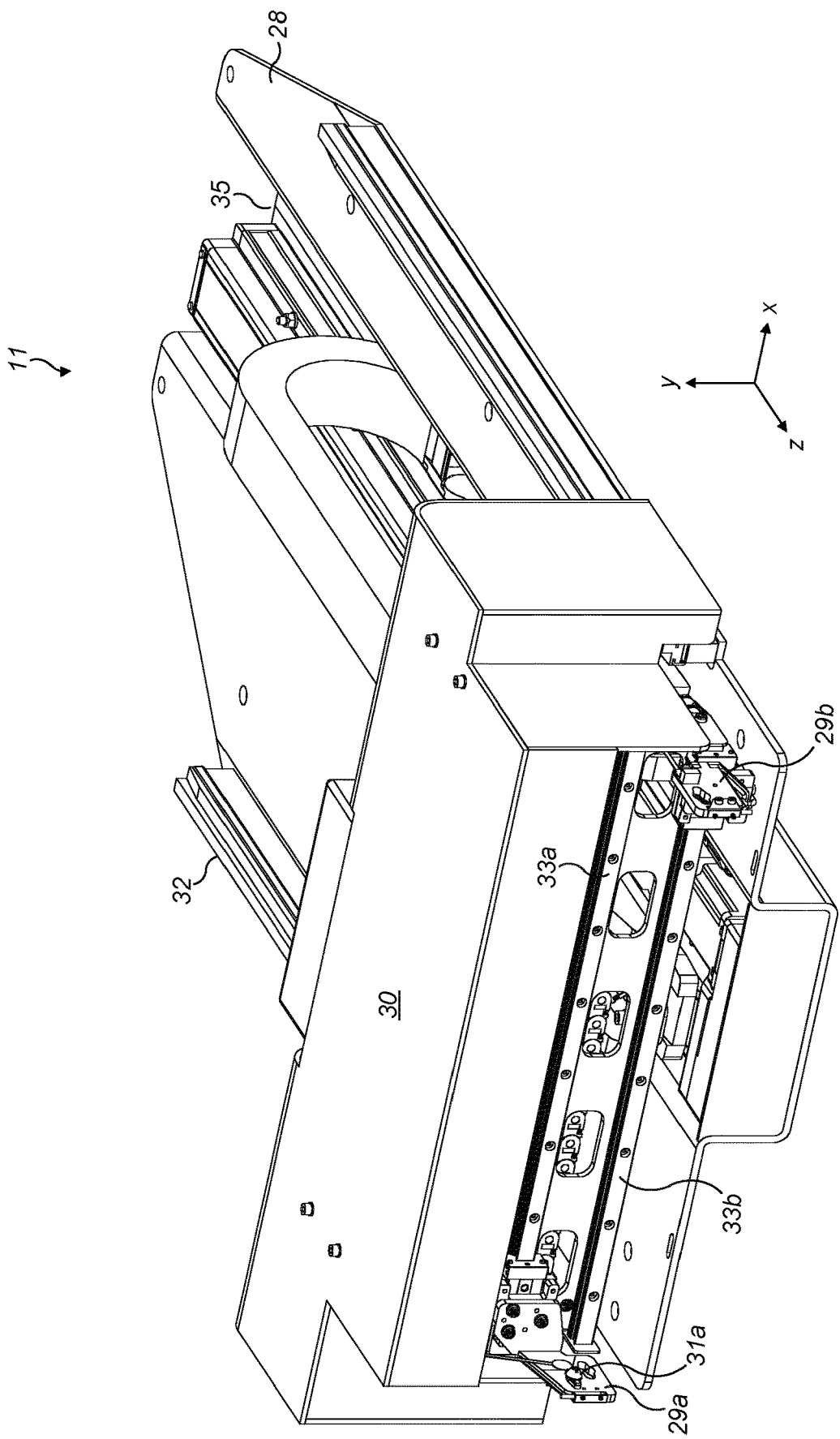
FIG. 3 is a perspective view of the secondary articulator of FIG. 2.
Figure 4:
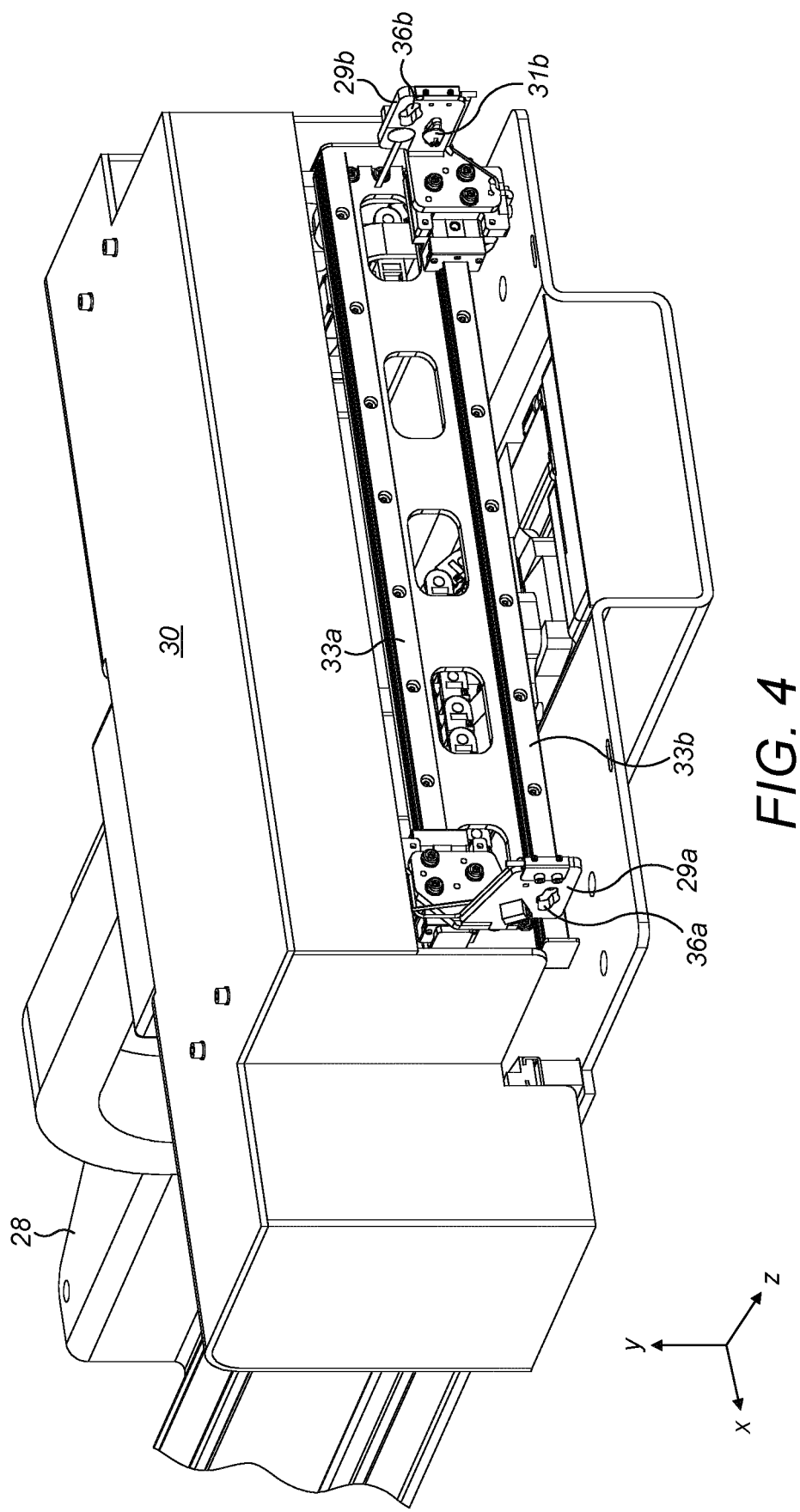
FIG. 4 is a further perspective view of the secondary articulator of FIG. 3.
Figure 5:
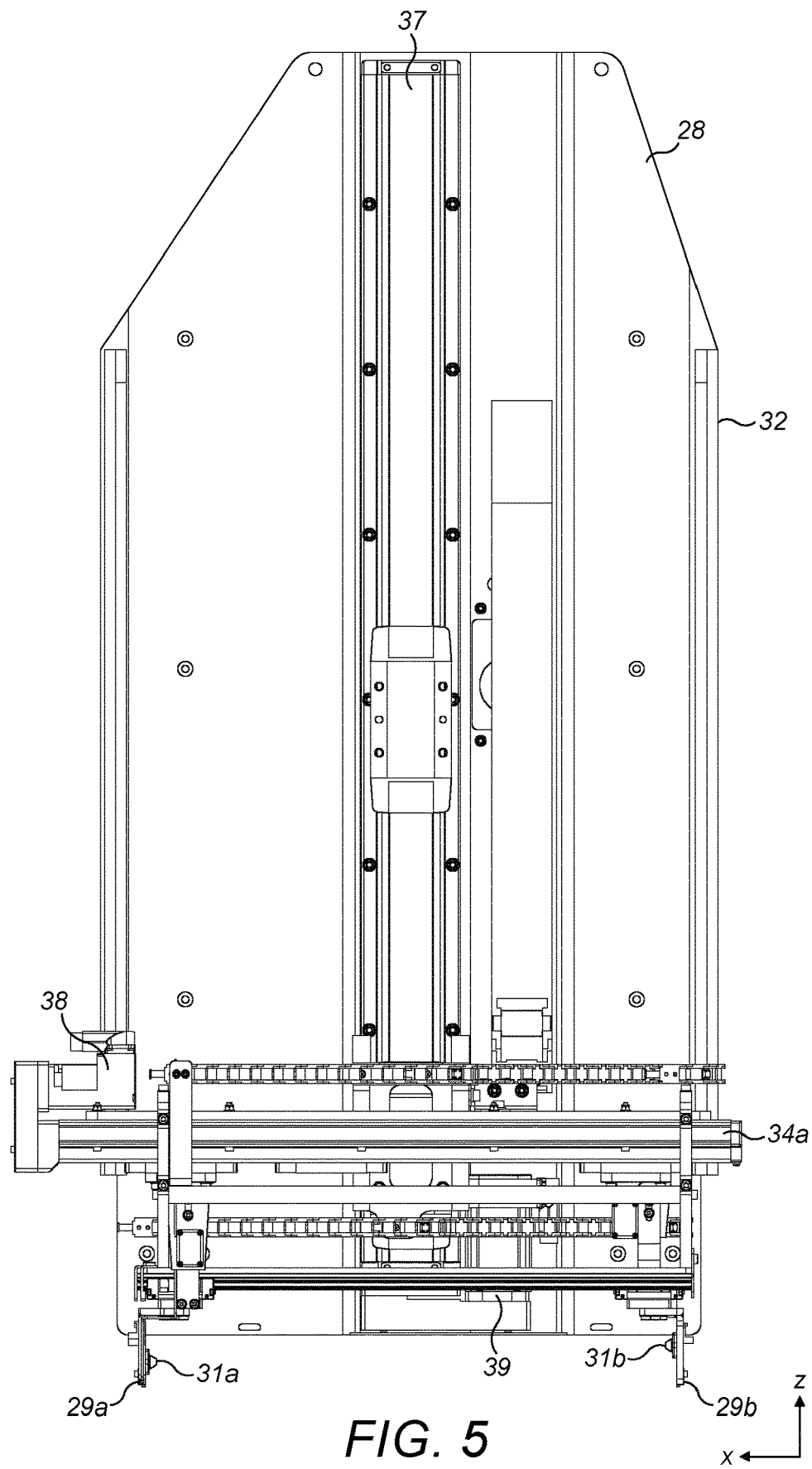
FIG. 5 is a plan view of the secondary articulator of FIG. 4 with selected components removed for illustrative purposes.

Referring to FIGS. 3, 4 and 5, secondary articulator 11 comprises a secondary support 28 implemented as a plate or 'tray'. Support 28 is elongate having a main length extending in the Z axis. A support channel 35 is recessed into and extends along the length of support 28 in the Z axis. Body 30 is movably mounted at support 28 via a track 37 (also extending in the Z axis and within channel 35) and an actuator 39 (implemented as an electric motor) to driveably transport body 30 in the Z axis along track 37 between a forward and rearward positions/ends of support 28. Support 28 further comprises a pair of rails 32 positioned at each lateral side of support 28. Rails 32 are adapted to contact and provide physical support to a node 12 when engaged by grippers 29, 29b and as it is transported along the Z axis via the movement of body 30 relative to support 28. Accordingly, rails 32 provide a stabilized and secure movement of nodes 12, ensuring they do not slide, shift or deflect from the linear transport in the Z axis.

Secondary articulator 11 comprises a pair of grippers 29 including a left gripper 29a and right gripper 29b spaced apart and movable relative to one another in the X axis. Each gripper 29a, 29b is supported for the linear lateral movement in the X axis via a respective left front support rail 33a and a right front support rail 33b extending laterally across body 30. Each gripper 29a, 29b comprises a respective engager indicated generally by reference 31a, 31b. According to the specific implementation, engagers 31a, 31b are implemented as respective lugs described further referring to FIG. 7. Each engager 31a, 31b provides a first half of a mechanical lock, with a second half of the lock provided at each node 12 and in particular one or more node tabs 54a, 54b (FIGS. 9 to 13). Each gripper 29a, 29b further comprises a recess or opening 36a, 36b, formed as a respective slot having a shape and size corresponding to that of each engager 31a, 31b. Each opening 36a, 36b is accordingly adapted to receive the alternate engager 31b, 31a when grippers 29a, 29b are actuated towards one another into engaging contact with a single tab 54c of a node 12c (referring to FIG. 10). That is, each opening 36a, 36b allows the grippers 29a, 29b to be brought into contact with the lateral side faces 95 of tab 54c and to avoid fouling each other.

Figure 6:
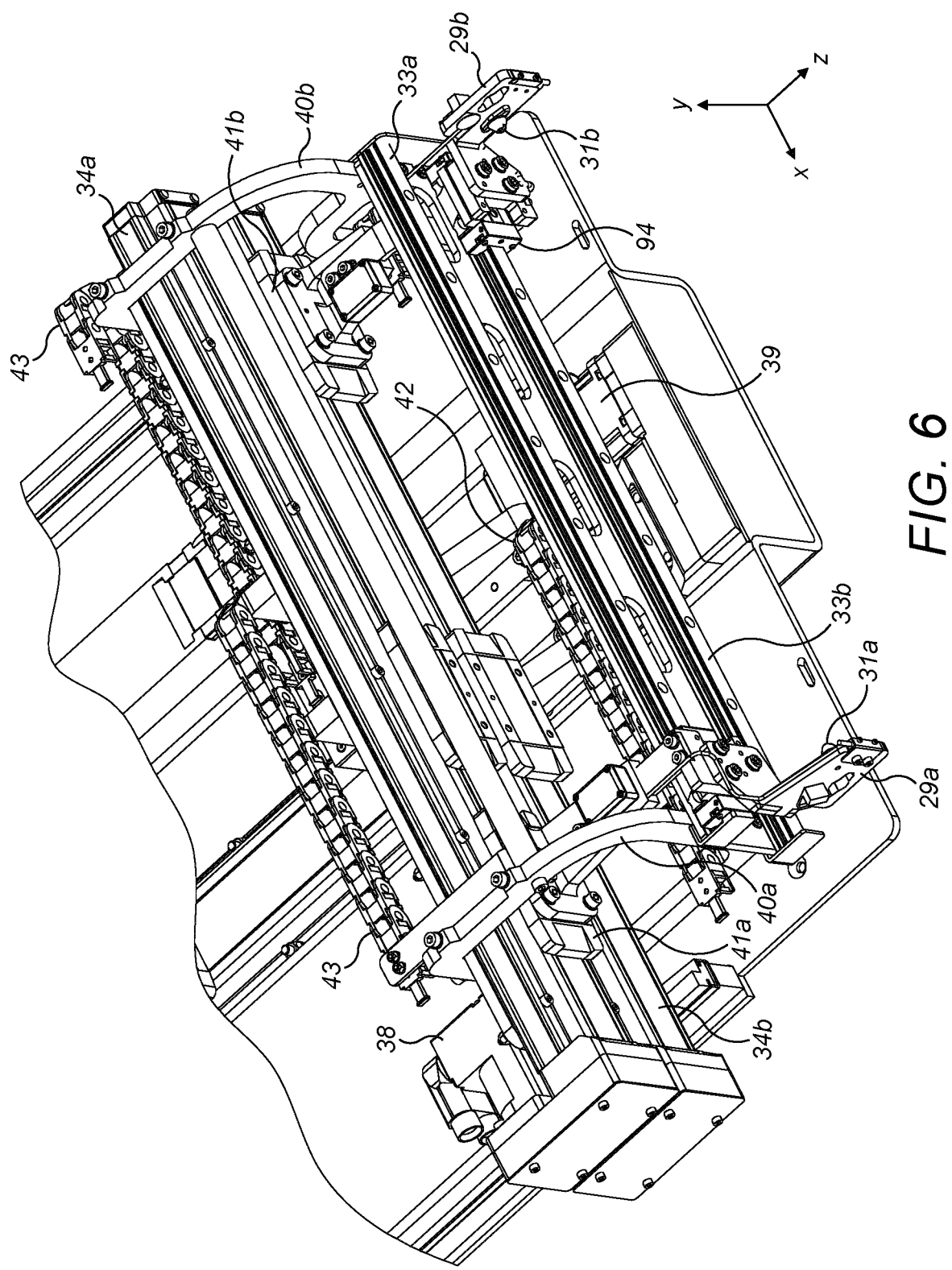
FIG. 6 is a plan-perspective view of a forward part of the secondary articulator of FIG. 5 with selected components removed for illustrative purposes.

Referring to FIGS. 5 and 6, each gripper 29a, 29b is coupled to a respective actuator, implemented as an electric motor 38, (only one motor is illustrated) via chain drives (not shown) that extend along (within or adjacent) each support rail 34a, 34b. Each of the motors 38 are controlled and operable independently so as to provide the independent lateral movement of grippers 29a, 29b in the X axis relative to body 30 and support 28. The lateral transport of each of the grippers 29a, 29b is further supported by a respective left rear support rail 34a and right rear support rail 34b positioned rearwardly in the Z axis from front support rails 33a, 33b. Front support rails 33a, 33b are mechanically linked to rear support rails 34a, 34b by respective left and right lateral end frames 40a, 40b so as to be provide a strong and rigid framework that supports the slidable mounting of the grippers 29a, 29b in the X axis.

Each gripper 29a, 29b is coupled and slidably mounted along each respective rail 33a, 33b, 34a, 34b via respective left and right rear sleds 41a, 41b. Additionally, each gripper 29a, 29b is further coupled to front rails 33a, 33b via respective front mounts 94 (only right mount 94 is illustrated). Accordingly, grippers 29a, 29b are slidably mounted along each of the respective rails as actuated independently by each of the motors 38. Drive of the lateral displacement of the grippers 29a, 29b is implemented via the respective chain drives (not shown) coupled to motors 38 and each gripper 29a, 29b. The secondary articulator 11 further comprises flexible cable grommets 42, 43 to house suitable electrical cabling for the electronic control of the slidable mechanical components described herein associated with the lateral drive of grippers 29a, 29b. According to further specific implementations, secondary articulator 11 may comprise a one or a single pair rails (33a, 33b, 34a, 34b).

Accordingly, and in use, body 30 is adapted for linear transport of the grippers 29a, 29b in the Z axis during insertion and withdrawal of nodes 12 at racks 13, 14. The nodes 12 may be engaged and disengaged by the present automated apparatus via the lateral movement of the grippers 29a, 29b in the X axis (laterally across body 30). As will be appreciated, engaging of nodes 12 is provided by movement of each gripper 29a, 29b in a direction towards one another whilst disengagement is provided by the movement in the opposite direction. Grippers 29a, 29b via actuating motors 38 are also configured for coordinated lateral displacement in the same direction so as to provide a corresponding lateral adjustment of node 12. Such a configuration is advantageous for 'fine' positional adjustment of the nodes 12 during withdrawal and particularly during insertion and mating with an electronic dock/slot (not shown) provided at each respective rack 13, 14 so as to electronically couple the nodes 12 to an electronic mother board or other electronic component(s) (not shown) at each respective rack 13, 14.

Each engager will now be described with reference to the right engager 31b. The engagers 31a, 31b according to the present apparatus, are configured to engage the same tab of a node or separate tabs. According to further implementations, each engager 31a, 31b may comprise a different shape and/or size so as to provide a further lock and key configuration such that left engager 31a is adapted for engaging exclusively in corresponding left tab or left side face of a tab with a different corresponding configuration provided at the right engager 31b. According to the present embodiment, engager 31b is formed as a lug projecting in the X axis from side face 95 of gripper 29b. Engager 31b comprises a generally rhombic shaped lug 47 having a length extending in the Z axis provided with a front shoulder 48a (positioned closest to a forwardmost/leading end or edge 53 of gripper 29b) and a rear shoulder 48b positioned furthest from front edge 53. Accordingly, lug 47 comprises a forward end 49a and rear end 49b. A head 46 projects laterally from lug 47 and comprises a generally domed or conical shape profile. Head 46 terminates at a tip 50 positioned laterally furthest from lug 47 representing a laterally innermost part of each respective gripper 29. Head 46 is enlarged in the Y axis relative to lug 47 so as to overhang lug 47.

Each gripper 29 further comprises a respective opening 36a, 36b. Each opening 36a, 36b comprises a slot central region 51 having a shape profile corresponding to that of head 46, a slot front region 52a having a shape profile corresponding to that of front shoulder 48a and a slot rear region 52b having a shape profile corresponding to rear shoulder 48b. Accordingly, as both the left and right grippers 29a, 29b are brought together in the X axis into touching or near touching contact, each respective engager 31a, 31b is received within the alternate opening 36b, 36a.

Figure 8:
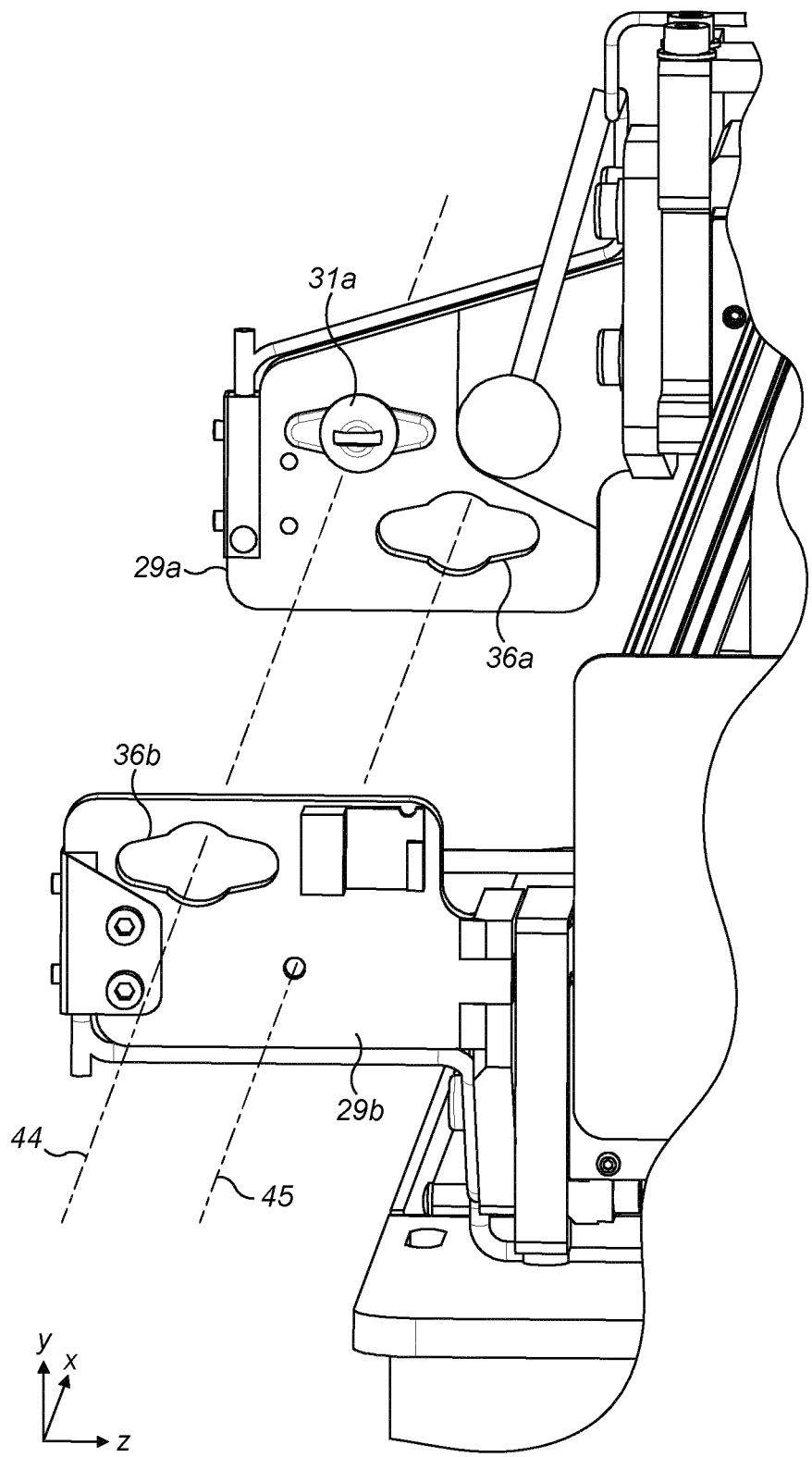
FIG. 8 is a side perspective view of opposed grippers provided at a forward region of the secondary articulator of FIGS. 3 to 6 for the releasable engagement of IT hardware nodes.

Referring to FIG. 8, the left and right engagers 31a, 31b are eccentrically mounted at each respective gripper 29a, 29b. That is, an axis 44 (extending in the X axis direction) bisecting the left engager 31a is offset in the Z and Y axes from a corresponding axis 45 (extending in the X axis direction) bisecting the right engager 31b. The lateral displacement of respective engager axes 44, 45 corresponds to a lateral displacement of the respective gripper openings 36a, 36b. That is, opening 36b is aligned and centred on the same axis 44 of left engager 31a and opening 36a is aligned and centred on axis of right engager 31b.

Figure 9:
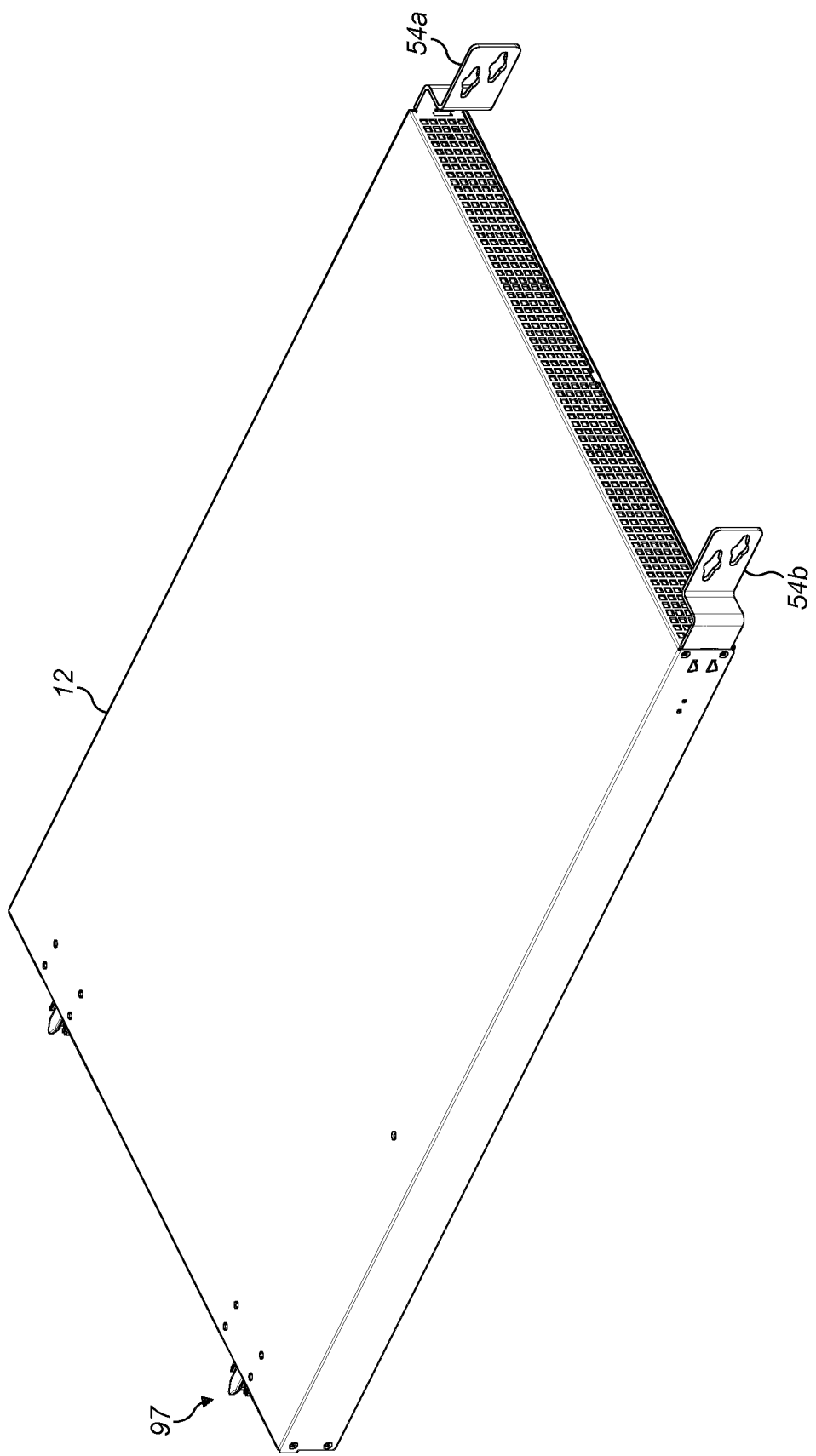
FIG. 9 is a perspective view of a first type of IT hardware node having a pair of engageable tabs.
Figure 10:
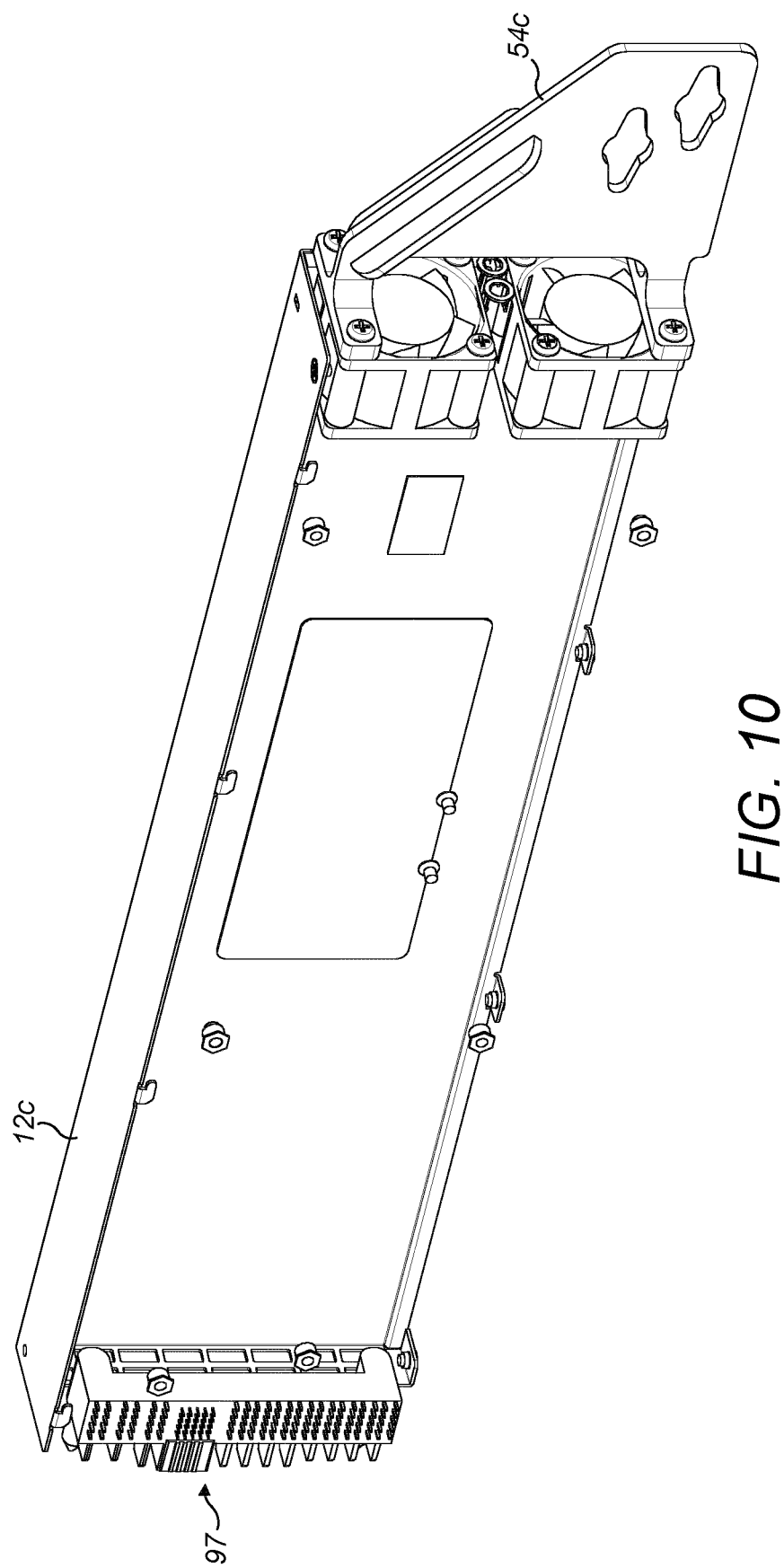
FIG. 10 is a perspective view of a second type of IT hardware node having a single engageable tab.

Referring to FIG. 9, a full width node 12 comprises a pair of laterally spaced apart tabs including in particular a right side tab 54a and a left side tab 54b. Node 12 comprises a generally plate-like shape profile corresponding to a typical IT server unit for removable mounting and interchange at racks 13, 14. Tabs 54a, 54b are provided at a forward lengthwise end of node 12 with one or a plurality of electronic ports 97 provided at an opposite lengthwise end and configured for docking with corresponding electronic receiving ports at each individual slot of IT hardware racks 13, 14. Referring to FIG. 10, a high density node 12c comprises a main body of much reduced size relative to full width node 12. Accordingly, a single tab 54c is provided at the opposite leading lengthwise end relative to the rear electronic port 97.

Figure 11:
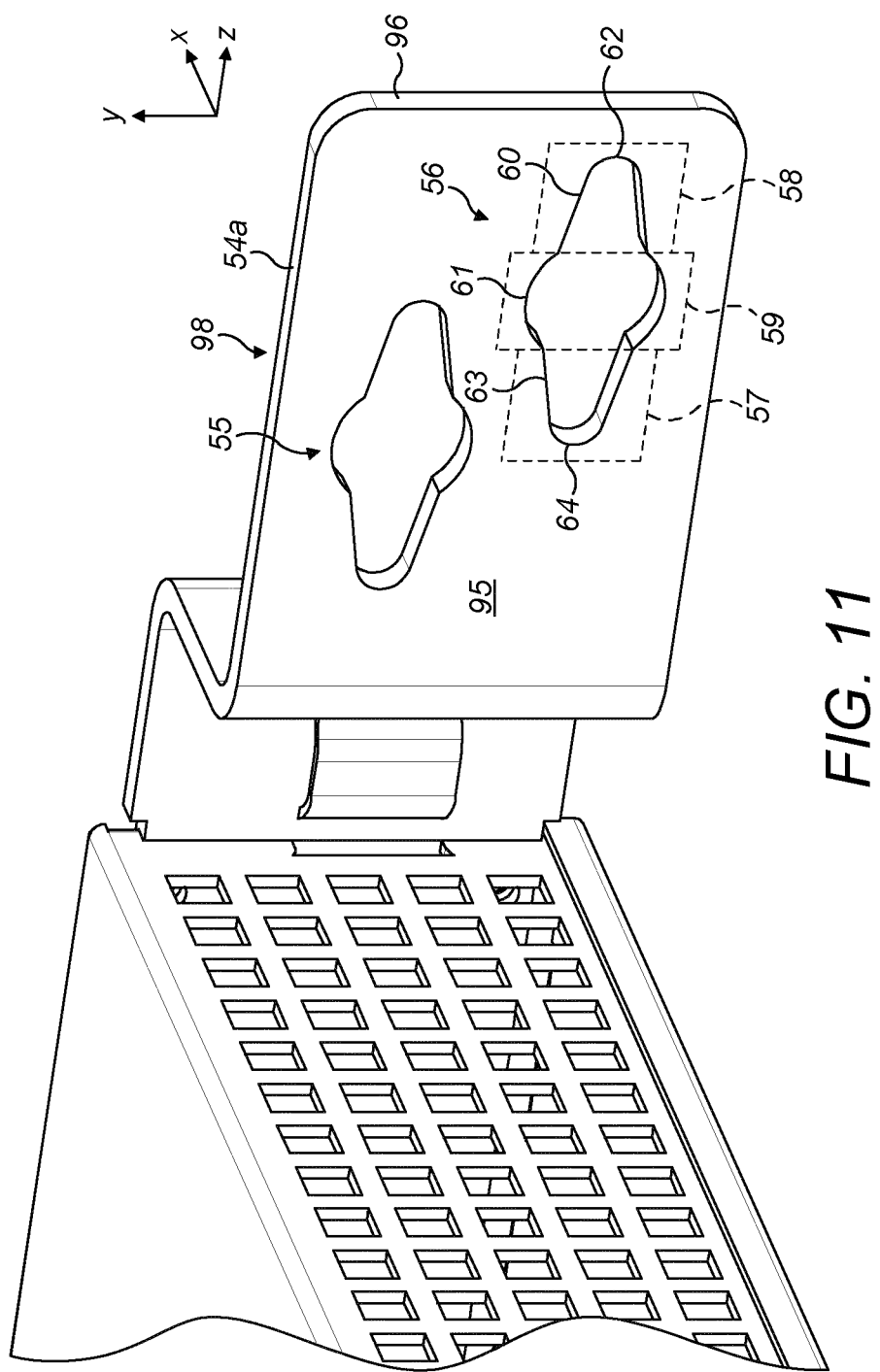
FIG. 11 is a magnified perspective view of a right tab of the IT hardware node of FIG. 9.
Figure 12:
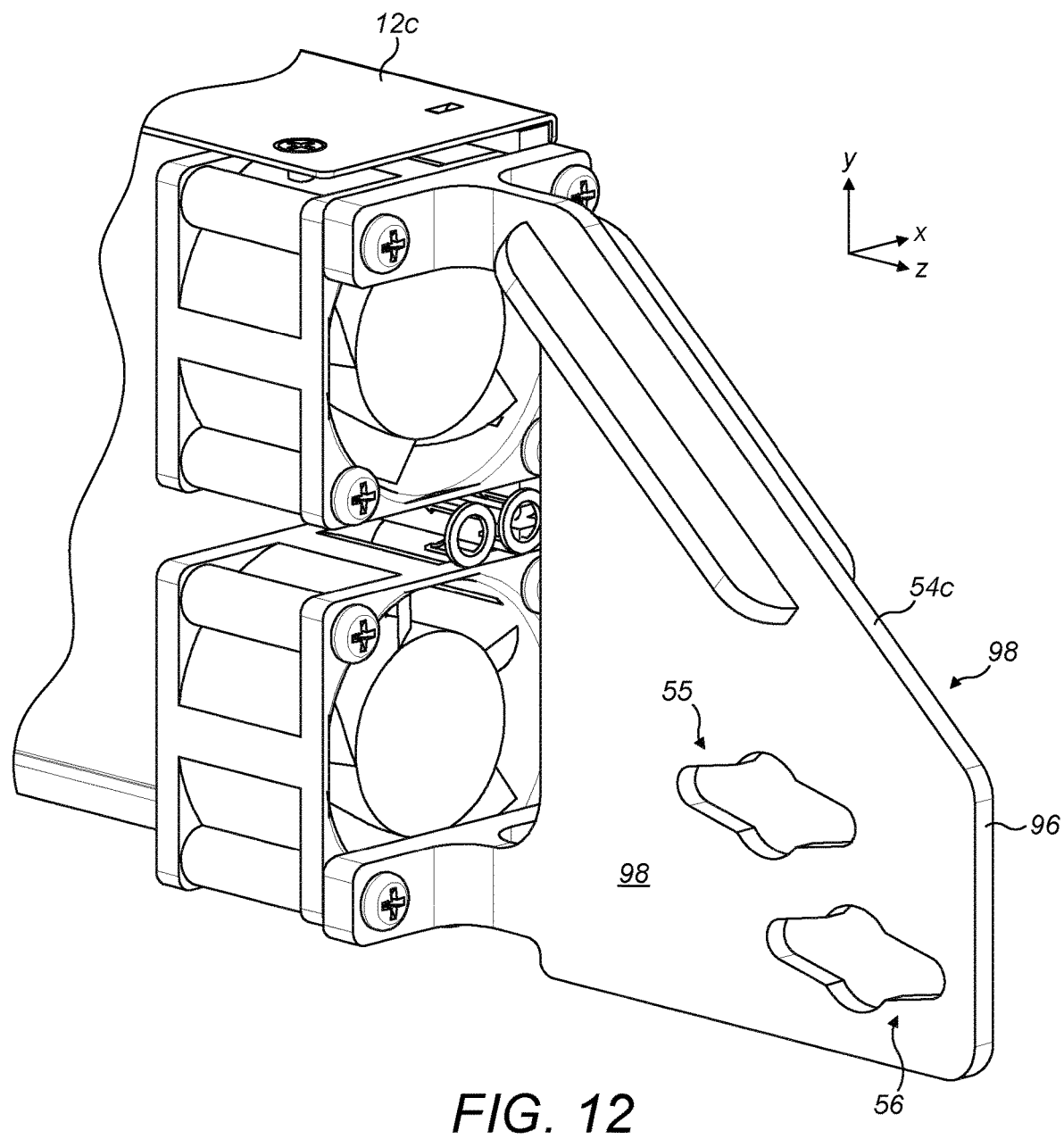
FIG. 12 is a magnified view of the tab of the IT hardware node of FIG. 10.

Referring to FIGS. 11 and 12, each tab 54a, 54b, 54c comprises a pair of openings 55, 56 that represent the second half of the engaging lock that provides the releasable locking of the nodes 12 by the grippers 29a, 29b. In particular, each opening 55, 56 is formed as an elongate slot having a generally rhombic shape profile. In particular, the size and shape of each opening 55, 56 corresponds to that of openings 56a, 56b provided at each respective gripper 29a, 29b configured to receive engagers 31a, 31b. In particular, each opening 55, 56, referring to a forwardmost or leading edge 96 of each tab 54a, 54c comprises a forward region 58 (positioned closest forwardmost edge 96 in a Z axis); a rear region 57 and a central region 59. Each opening 55, 56 (in the Z axis direction) at the respective forward regions 58 and rearward regions 57 are tapered 60, 63 (reduced width in the Y axis) that as decreases from the central region 59 towards respective forward and rearward ends 62, 64. Each opening 55, 56 is enlarged at the central region 59 to comprise an arcuate (part circular) opening 61 with a curvature corresponding to a perimeter of the domed head 46 of each engager 31a, 31b.

A thickness of each engager lug 47 is approximately equal to a thickness (in the X axis) of each tab 54a, 54b, 54c such that lug 47 of each engager 31a, 31b may be housed and accommodated substantially within each opening 55, 56. As engager head 46 projects from lug 47, head 46 projects laterally inward from each opening 55, 56. With each engager 31a, 31b inserted within a respective tab opening 55, 56, an underside surface of each head 46 is configured for positioning opposite and opposed to side face 98 of tabs 54a, 54b, 54c. In particular, a length in the Z (and the Y) axis direction of each engager 31a, 31b is slightly less than a corresponding length in the Z (and the Y) axis direction of each opening 55, 56 so as to allow a small finite lengthwise displacement of each engager 31a, 31b within each respective slot/opening 55, 56. As the body 30 is displaced relative to secondary support 28 by the linear transportation in the Z axis, each engager 31a, 31b undergoes a small positional shift (when pushing or pulling nodes 12, 12c during insertion and withdrawal) such that head 46 overlaps slightly the respective forward and rearward regions 58, 57. In such a position, with the underside surface of each head 46 positioned adjacent faces 98, each engager 31a, 31b may not be withdrawn laterally (in the X axis) from each opening 55, 56. Accordingly, the nodes 12, 12c are releasably locked and gripped by the secondary articulator 11 via grippers 29a, 29b. Releasable locking of the nodes 12, 12c by the grippers 29a, 29b is also provided by the lateral engagement and positional locking/lateral clamping of the grippers 29a, 29b that are moved into close touching contact against faces 98 of the respective tabs 54a, 54c via the action of lateral displacement motors 38.

According to further implementations, each engager 31a, 31b may not include the domed head 46 such that the locking action is provided exclusively by the locking in position of the grippers 29a, 29b in a gripped/clamped position onto the respective tabs 54a, 54b, 54c by the action of motors 38 as described referring to FIG. 6. In such a further embodiment, the size and shape of engagers 31a, 31b may be the same as the openings 55, 56 so as to allow close fitting insertion and accommodation of the lugs 47 into openings 55, 56.

Figure 7:
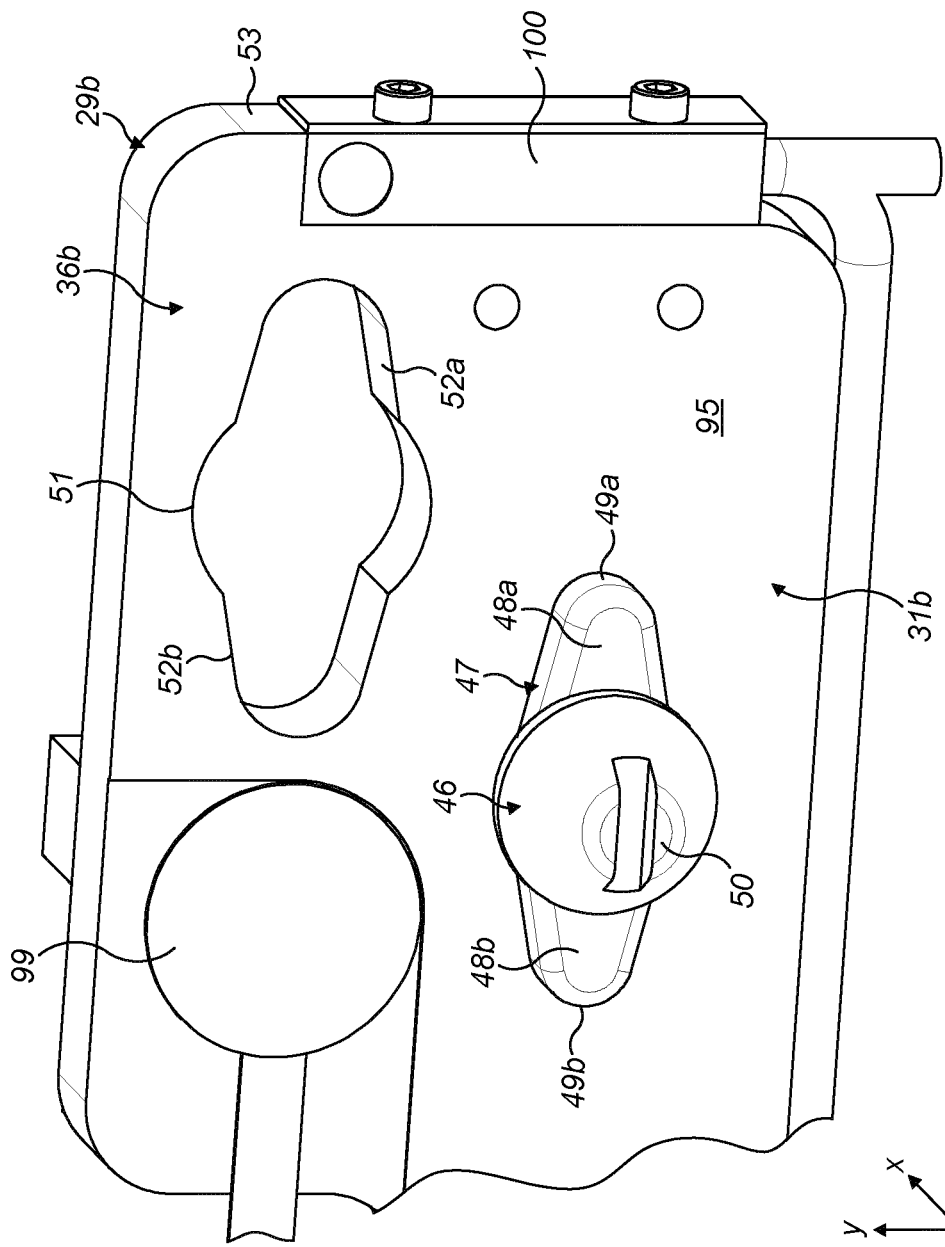
FIG. 7 is a magnified perspective view of a gripper having an engager for the releasable engagement of IT hardware nodes and forming part of the secondary articulator of FIGS. 3 to 6.
Figure 13:
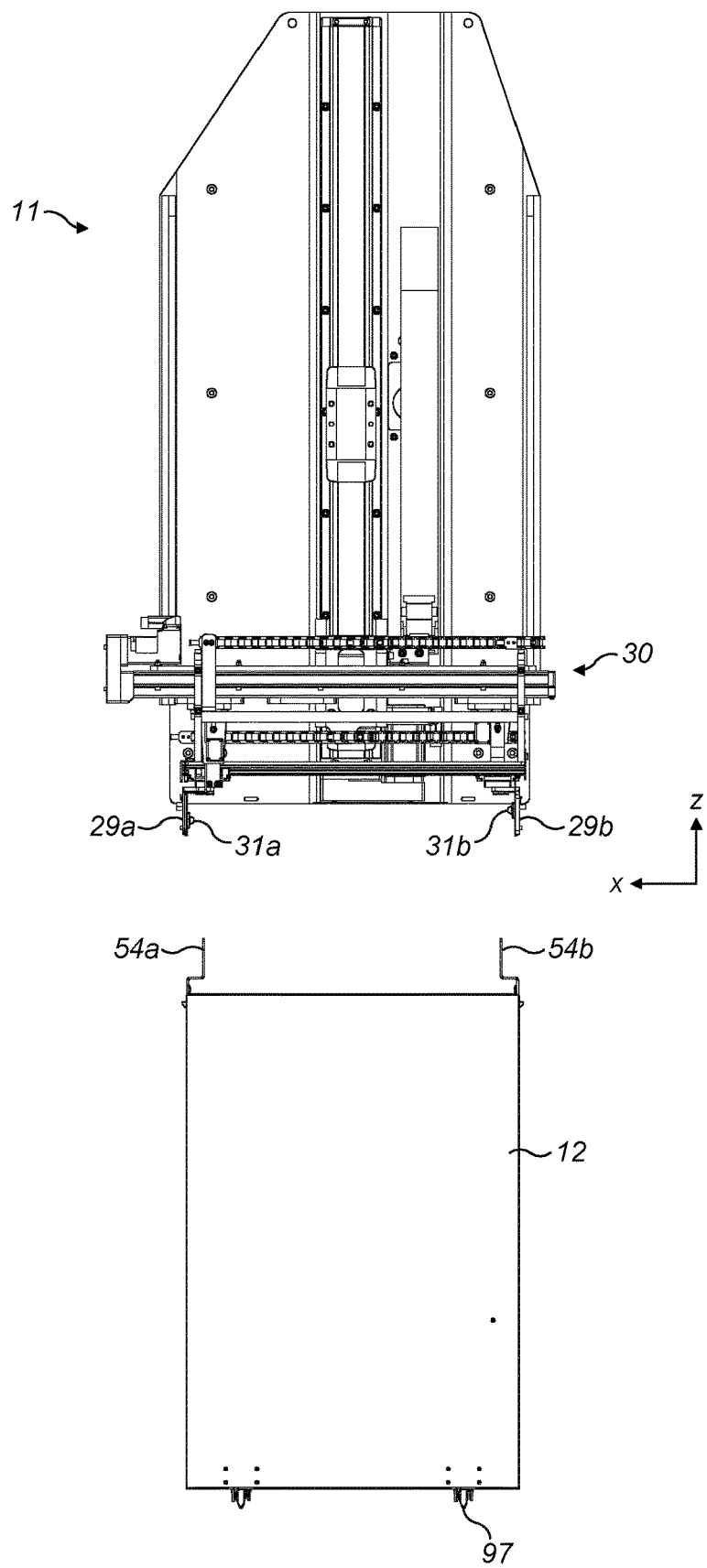
FIG. 13 is a plan view of the secondary articulator of FIGS. 3 to 6 positioned proximate to the IT hardware node of FIG. 9 for releasable engagement via the grippers of FIG. 8.

Referring to FIGS. 7 and 13, each gripper 29a, 29b comprises a contact/tactile sensor 99 to provide monitoring and feedback on the touching contact between engagers 31a, 31b and the respective tabs 54a, 54b, 54c. Each of the grippers 29a, 29b further comprises an inductive sensor 100 configured to monitor and provide feedback on a proximity of each engager 31a, 31b relative to each opening 55, 56. Such electronic sensors 99, 100 are also adapted to provide positional motion sensing of each gripper 29a, 29b relative to one another and any other mechanical or electronic component forming part of the present system. As indicated, the present apparatus may comprise further electronic sensors to monitor respective movement (including linear translation and rotation) of the various mechanical and electronic components of the present system associated with the primary and/or secondary articulators 10, 11.

Figure 14:
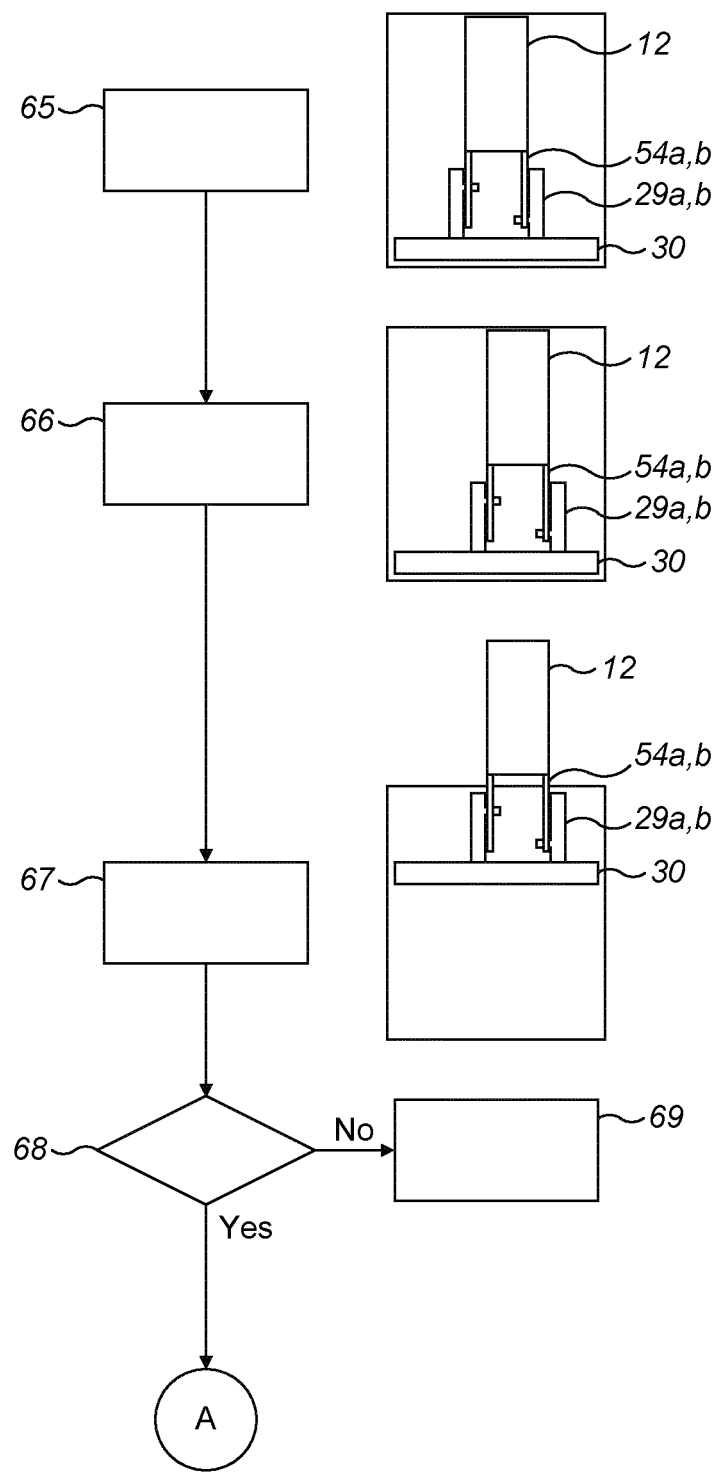
FIG. 14 is a schematic flow diagram of the initial stages of the sequence of inserting an IT hardware node at one of the IT hardware racks of FIG. 1 according to a specific implementation.
Figure 15:
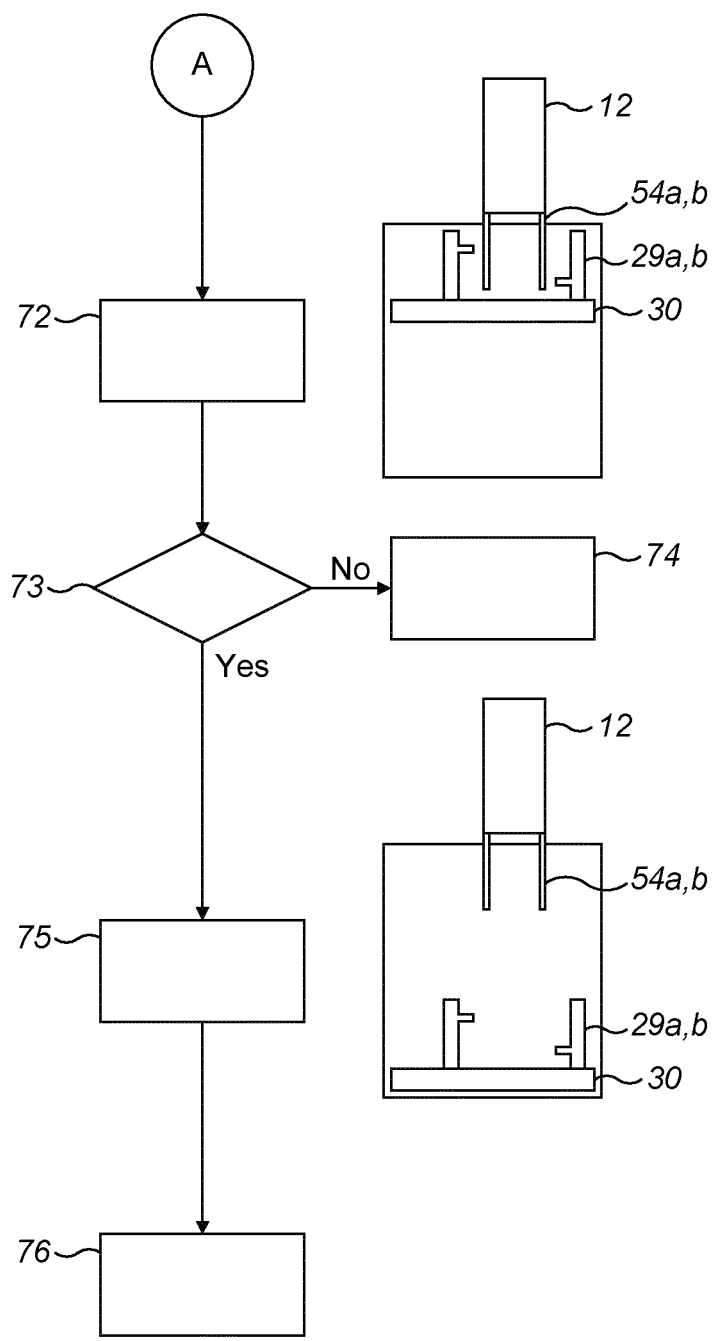
FIG. 15 is a is a schematic flow diagram of the final stages of the sequence of inserting an IT hardware node at one of the IT hardware racks of FIG. 1 according to a specific implementation.

Referring to FIGS. 13, 14 and 15, an implementation of the present apparatus and system is described for a placement or insertion of node 12, 12c into a slot (not shown) within anyone of IT racks 13, 14. With node 12 already engaged and gripped by the secondary articulator 11, via grippers 29a, 29b and node tabs 54a, 54b, at stage 65, the apparatus is adapted for insertion of the node into the rack 13, 14. Accurate and efficient mating of the node 12 by the grippers 29a, 29b is facilitated, in part, by the utilisation of sensors 99, 100. Node 12 may have been transported already by primary articulator 10 and in particular AGV/support 18 (controlled remotely via control unit 15). At stage 66, node 12 is aligned with a slot (not shown) at racks 13, 14. This may comprise lateral displacement of the grippers 29a, 29b in the X axis to make finite positional adjustments for docking of ports 97. Body 30 is then displaced linearly along support 28 in the Z axis at stage 67 so as to insert node 12 into the slot. At stage 68, control unit 15 via suitable electronic sensors is configured to determine if node 12 and in particular port 97 are appropriately aligned with a base/side of the IT rack 13, 14 to ensure the accurate and efficient mating with a desired electronic dock/slot (not shown) within rack 13, 14a. If it is determined via the sensors that node 12 is inappropriately or misaligned, control unit 15 is configured to issue further positional translational adjustments or an error message at stage 69. Such adjustments may comprise specific and independent control of the various actuators provided at the primary articulator 10 and/or the secondary articulator 11 as described referring to FIGS. 2 to 6. Referring to FIG. 15, at stage 72, tabs 54a, 54b are disengaged by grippers 29a, 29b via lateral outward movement of the grippers 29a, 29b away from one another in the X axis along body 30. The releasable lock is accordingly disengaged. At stage 73, control unit 15 via the appropriate sensors identifies release of the node 12. If, via sensor detection, release does not occur, any one of the actuators associated with the primary and secondary articulators 10, 11 are actuated. Additionally, an error may be reported to a user via user interface 17 and cloud network 16 at stage 74. Human intervention may be required. If at stage 73 an uncoupling is identified by the electronic sensors, body 30 is displaced in the Z axis along support 28 at stage 75 to positionally retract the secondary articulator 11 from the node 12. The insertion process is accordingly confirmed and completed at stage 76.

Figure 16:
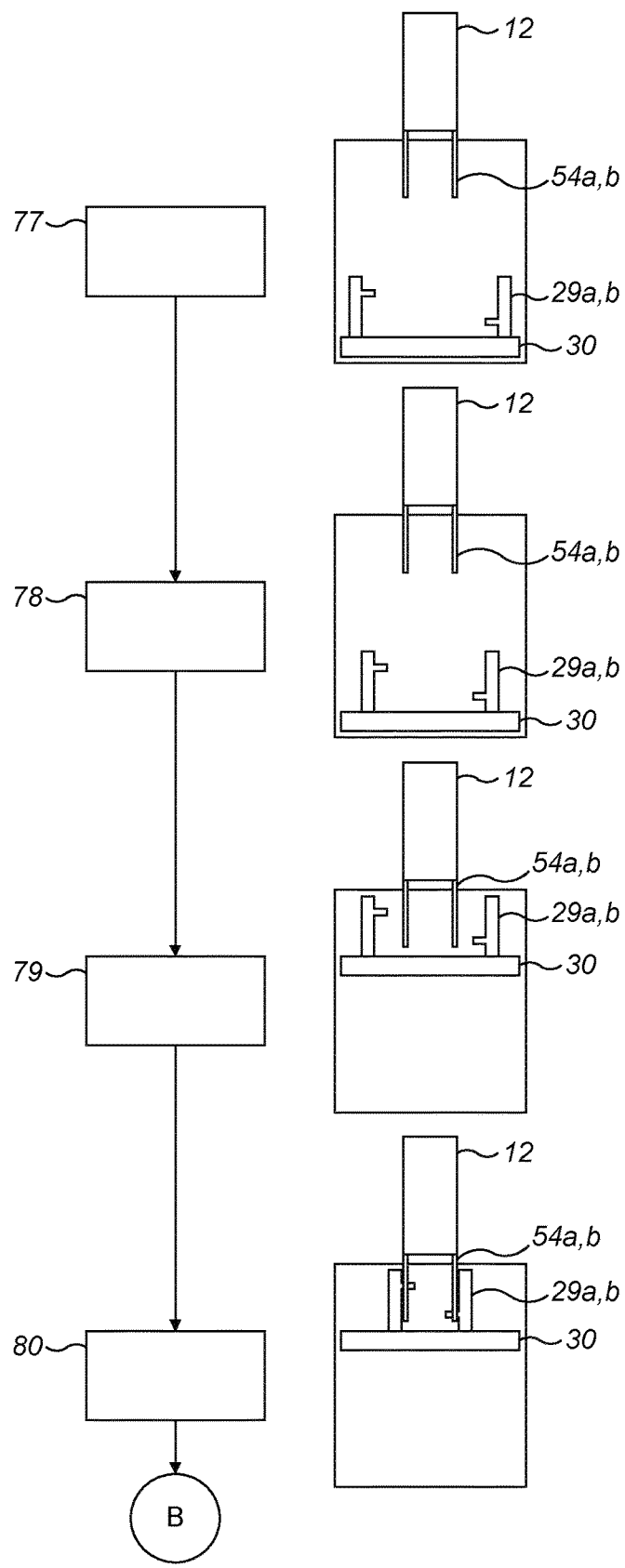
FIG. 16 is a schematic flow diagram of the initial stages of the sequence of withdrawing an IT hardware node at one of the IT hardware racks of FIG. 1 according to a specific implementation.
Figure 17:
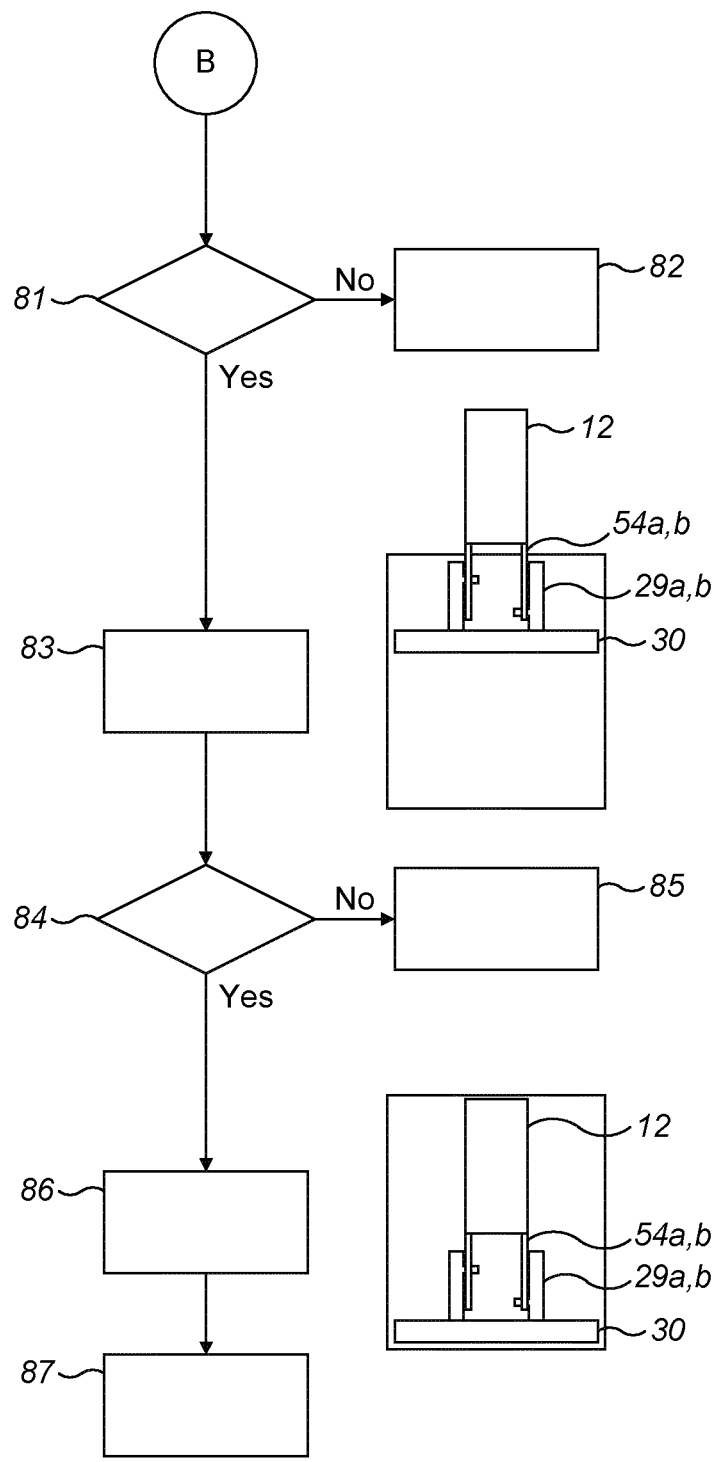
FIG. 17 is a schematic flow diagram of the final stages of the sequence of withdrawing an IT hardware node at one of the IT hardware racks of FIG. 1 according to a specific implementation.

An opposite withdrawal sequence is described referring to FIGS. 16 and 17. As will be appreciated, the secondary articulator 11 is brought into position adjacent node 12 via movement of the primary articulator 10 (via AGV support 18) as controlled by control unit 15 at stage 77. At stage 78, grippers 29a and 29b are transported in the lateral X axis towards one another. At stage 79, articulator body 30 is advanced in a Z axis along support 28 towards node 12 (mounted within IT rack 13, 14). At stage 80, grippers 29a, 29b are actuated in the X axis by displacement towards one another so as to appropriately interengage engagers 31a, 31b into the respective openings 55, 56. At stage 81, control unit 15 via the electronic sensors is configured to identify the desired physical engagement and locking of the respective engager lugs 47 into the opening 55, 56. Control unit 15 at stage 81 may then be operative to make further positional adjustments of the grippers 29a, 29b so as to provide engagement. Alternatively, at stage 82, an error may be reported to a user via user interface 17 and cloud network 16. At stage 83, grippers 29a and 29b are adjusted in the lateral X axis to try and achieve locking engagement with the tabs 54a, 54b. At stage 84, control unit 15 via the electronic sensors is configured to again check/identify the desired physical engagement and locking of the respective engager lugs 47 into the opening 55, 56. At stage 85, if incorrect engagement is identified a further error message may be reported to a user via user interface 17 and cloud network 16 and/or primary and secondary articulators 10, 11 are controlled via any one of the electronically controlled actuators to make further positional adjustments. At stage 86, if the desired mating of the two connection locking parts of the secondary articulator 11 and node 12 is confirmed, control unit 15 proceeds with the withdrawal action in which body 30 is withdrawn in the Z axis along support 28 so as to extract node 12 from the rack 13, 14 via linear displacement in the Z axis. The withdrawal sequence is terminated at end stage 87. The extracted node 12 may then be transported from the rack 13, 14 via the AGV support 18.

Figure 18:
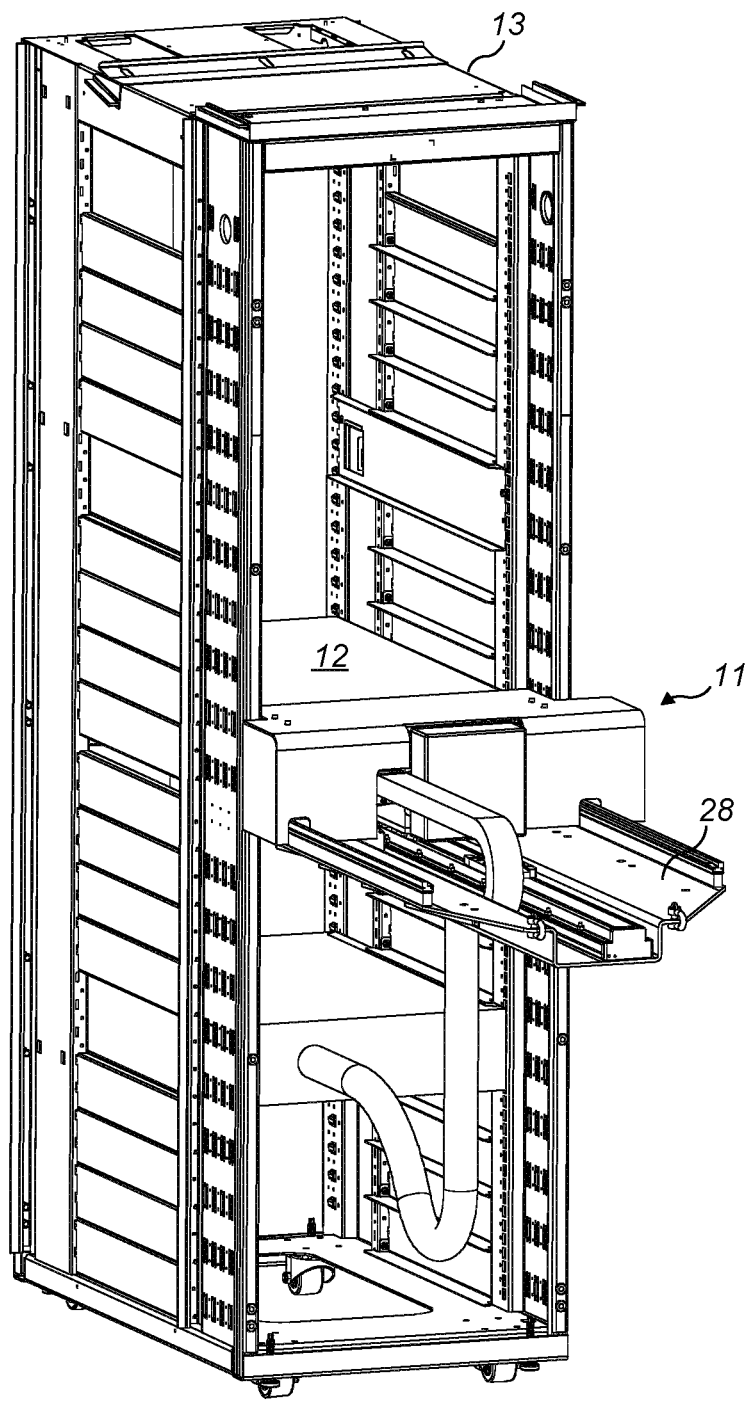
FIG. 18 is a perspective view of the secondary articulator of FIGS. 3 to 16 mounted on a static support for illustrative purposes and positioned for the insertion and withdrawal of an IT hardware node at one of the IT hardware racks of FIG. 1.
Figure 19:
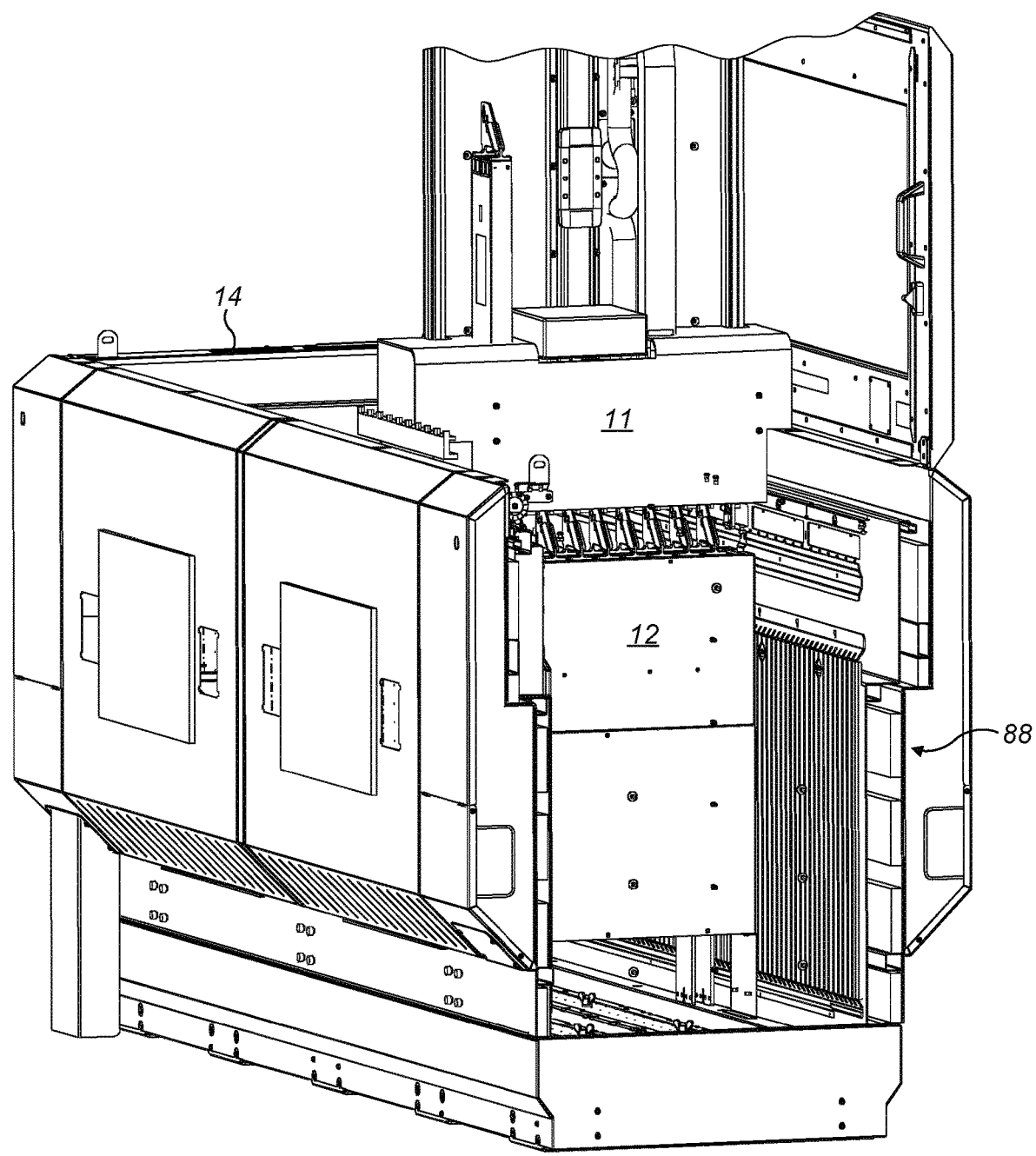
FIG. 19 is a perspective view of the secondary articulator of FIGS. 3 to 6 positioned for the insertion and withdrawal of IT hardware nodes at one of the IT hardware racks of FIG. 1.

FIGS. 18 and 19 illustrate the localised interfacing of the secondary articulator 11 with the racks 13, 14. In particular, a node 12 at rack 13 may be inserted and withdrawn whilst node 12 is held in a generally horizontal orientation. IT rack 13 may be a conventional IT hardware rack having a fan/air cool system. Referring to FIG. 19, the present apparatus and method is equally compatible for use with immersion cooling IT hardware baths in which a coolant liquid is housed within an immersion cooling bath chamber 88 forming part of an immersion cooling bath. In such implementations, nodes 12 are typically suspended and supported vertically within the chamber 88 such that secondary articulator 11 is operative with the Z axis that is aligned generally vertically.

Accordingly, withdrawal of the nodes 12 occurs against gravity whilst insertion is with gravity. The present releasable locking mechanism (comprising engagers 31a, 31b and openings 55, 56) is compatible for releasable engagement and orientational adjustment of nodes 12 between the two mounting positions of the fan or air cooled IT hardware rack 13 and the immersion liquid cooled rack/bath 14. As indicated, the manipulator arm 19 and the various pivot joints 21, 26, 90; the linear and rotary actuators (not shown) are configured via control unit 15 to re-orientate node 12 between the horizontal and vertical mountings at the different types of rack 13, 14.

The present system comprising in particular the laterally engageable grippers 29a, 29b is adapted for compatibility with all types of IT hardware node and rack installations. In particular, the present system may be retro-fitted to all manner of existing IT hardware installations that may utilise different types, sizes and shapes of IT hardware rack 13, 14 and hardware nodes 12, 12c. In particular, the grippers 29a, 29b via their independent lateral actuation are configured to provide a secure hold whilst a node 12 is rotated and/or transported between different locations and at different orientations. The present system via the various linear and rotary actuators operating in multiple different rotational axes and linear axes is adapted for the finite and precise positional adjustment of nodes 12, 12c to accommodate docking tolerances of around 1 mm and less than 1 mm.

Additionally, the present system via the releasable locking action of the engagers 31a, 31b with the tabs 54a, 54b, 54c provides a secure and reliable hold of the nodes 12, 12c during all parts/steps of the node manipulation sequences.

The invention claimed is:

1. An IT hardware apparatus for the positional interchange of IT hardware nodes at an IT hardware rack comprising:
   at least one tab attached or attachable to IT hardware nodes removably mountable within an IT hardware rack;
   each of the tabs provided with a first lock part;
   an articulator unit having at least one movable gripper to releasably engage the tabs; and
   the movable gripper provided with a second lock part to releasably lock to the first lock part and allow the gripper to releasably support each of the IT hardware nodes via the tabs for insertion and/or withdrawal at the IT hardware rack;
   wherein the first lock part comprises at least one opening and the second lock part comprises at least one lug having a shape and size approximately equal to a shape and size of the opening to enable the lug to be received within the opening.

2. The IT hardware apparatus as claimed in claim 1 wherein the opening and the lug are generally elongate in a lengthwise direction of each tab and/or IT hardware node.

3. The IT hardware apparatus as claimed in claim 1 wherein the opening and the lug comprise a width that decreases in a direction towards a front part of the respective opening and the lug, the front part being furthest from an attachment part of each tab for attachment to the IT hardware node relative to a rear part of the opening and the lug.

4. The IT hardware apparatus as claimed in claim 1 wherein the opening and the lug comprise a width that decreases in a direction towards a rear part of the opening and the lug, the rear part being closest to an attachment part of each tab for attachment to the IT hardware node relative to a front part of the opening and the lug.

5. The IT hardware apparatus as claimed in claim 1 wherein the opening and the lug comprise a generally rhombic shape profile.

6. The IT hardware apparatus as claimed in claim 1 wherein the lug comprises a body having a front and a rear shoulder and a head projecting from the body at a position between the front and rear shoulder.

7. The IT hardware apparatus as claimed in claim 6 wherein the head comprises a tapered thickness that decreases in a direction away from the body.

8. The IT hardware apparatus as claimed in claim 7 wherein a shape profile of the head is any one of a cone, a dome or a barb.

9. The IT hardware apparatus as claimed in claim 8 wherein the first lock part is a slot and the body of the lug comprises a thickness being equal to or greater than a thickness of the tab such that the head is capable of insertion completely through the slot from a first side surface of the tab such that an underside surface of the head is positionally opposed to a second side surface of the tab.

10. The IT hardware apparatus as claimed in claim 1 wherein the articulator unit comprises two movable grippers movably mounted at a unit body and configured for lateral movement at the unit body towards one another and in to engaging contact with at least one tab of the IT hardware node.

11. The IT hardware apparatus as claimed in claim 10 wherein each of the grippers comprise a respective lug.

12. The IT hardware apparatus as claimed in claim 10 having one or two tabs for each of the IT hardware nodes, each tab having at least one slot.

13. The IT hardware apparatus as claimed in claim 1 comprising a set of the IT hardware nodes, the set comprising any one or a combination of a computer node to perform computational tasks, power nodes to supply power to other of the IT hardware nodes and battery nodes.

14. The IT hardware apparatus as claimed in claim 13 wherein some of the IT hardware nodes comprise a first size and have two tabs and some of the IT hardware nodes comprise a second size smaller than the first size and have one tab.

15. The IT hardware apparatus as claimed in claim 1 wherein the IT hardware rack is an immersion cooling bath to contain an immersion cooling liquid, the IT hardware nodes being mountable within the immersion cooling bath and capable of immersion within the immersion cooling liquid such that the tabs project upwardly above a surface of the immersion cooling liquid.

16. The IT hardware apparatus as claimed in claim 15 comprising a plurality of electronic ports provided at a base of the immersion cooling bath, each of the IT hardware nodes configured to dock mechanically and electrically with the electronic ports.

17. The IT hardware apparatus as claimed in claim 16 wherein each of the IT hardware nodes comprise an electronic key to couple with each of the respective electronic ports to provide the mechanical and electrical dock.

18. A method of releasable mechanical engagement of IT hardware nodes at an IT hardware rack comprising:
    providing a plurality of IT hardware nodes for insertion in an IT hardware rack;
    each of the IT hardware nodes having at least one tab projecting from an end region of the IT hardware nodes and provided with a first lock part;
    providing an articulator unit having at least one movable gripper provided with a second lock part;
    actuating the articulator unit to move the gripper to provide releasable engagement of the first lock part by the second lock part of one of the IT hardware nodes;
    wherein after engagement of the first and second lock parts, an IT hardware node is capable of being inserted at the IT hardware rack;
    wherein the first lock part comprises at least one opening and the second lock part comprises at least one lug having a shape and size approximately equal to a shape and size of the opening to enable the log to be received within the opening.

19. The method as claimed in claim 18 wherein the articulator unit comprises two movable grippers each having a second lock part to engage one or two first lock parts of one of the IT hardware nodes.

20. The method as claimed in claim 18 wherein the opening and the lug are elongate in a lengthwise direction of each IT hardware node.

21. The method as claimed in claim 18 wherein the opening and the lug comprise a width that decreases in a direction towards a front part of the opening and the lug, the front part being furthest from the IT hardware node relative to a rear part of the opening and the lug.

22. The method as claimed in claim 18 wherein the opening and the lug comprise a width that decreases in a direction towards a rear part of the opening and the lug, the rear part being closest to the IT hardware node relative to a front part of the opening and the lug.

23. A method of releasable mechanical engagement of IT hardware nodes at an IT hardware rack comprising:
    providing a plurality of IT hardware nodes for withdrawal from the IT hardware rack;
    each of the IT hardware nodes having at least one tab projecting from an end region of the IT hardware nodes and provided with a first lock part;
    providing an articulator unit having at least one movable gripper provided with a second lock part;
    actuating the articulator unit to move the gripper to provide releasable engagement of the first lock part by the second lock part of one of the IT hardware nodes;
    wherein after engagement of the first and second lock parts, an IT hardware node is capable of being withdrawn from the IT hardware rack;
    wherein the first lock part comprises at least one opening and the second lock part comprises at least one lug having a shape and size approximately equal to a shape and size of the opening to enable the lug to be received within the opening.

* * * * *